United States Patent
Im et al.

(10) Patent No.: US 12,394,687 B2
(45) Date of Patent: Aug. 19, 2025

(54) SEMICONDUCTOR PACKAGE INCLUDING A HEAT DISSIPATION STRUCTURE

(71) Applicant: SAMSUNG ELECTRONICS CO., LTD., Suwon-si (KR)

(72) Inventors: Yunhyeok Im, Hwaseong-si (KR); Youngsang Cho, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 477 days.

(21) Appl. No.: 18/052,187

(22) Filed: Nov. 2, 2022

(65) Prior Publication Data

US 2023/0290701 A1    Sep. 14, 2023

(30) Foreign Application Priority Data

Nov. 26, 2021   (KR) .......................... 10-2021-0165882

(51) Int. Cl.
*H01L 23/02*       (2006.01)
*H01L 23/31*       (2006.01)
*H01L 23/367*      (2006.01)
*H01L 23/373*      (2006.01)
*H01L 23/498*      (2006.01)
*H01L 23/00*       (2006.01)

(52) U.S. Cl.
CPC ........ *H01L 23/367* (2013.01); *H01L 23/3128* (2013.01); *H01L 23/3736* (2013.01); *H01L 23/49811* (2013.01); *H01L 23/49822* (2013.01); *H01L 24/16* (2013.01); *H01L 2224/16227* (2013.01)

(58) Field of Classification Search
CPC ............... H01L 23/367; H01L 23/3128; H01L 23/3736; H01L 23/49811; H01L 23/49822; H01L 24/16; H01L 2224/16227; H01L 23/552; H01L 2224/81; H01L 21/56; H01L 23/3142; H01L 23/315; H01L 23/3733; H01L 25/105; H01L 23/3677; H01L 23/5389; H01L 23/49816
USPC ......................................................... 257/668
See application file for complete search history.

(56) References Cited

U.S. PATENT DOCUMENTS 6,291,012 B1   9/2001  Miyasaka
6,364,932 B1   4/2002  Ji et al.
(Continued)

FOREIGN PATENT DOCUMENTS

| JP | H10-217694 | 8/1998 |
| KR | 10-2006-0092692 | 8/2006 |
| WO | WO 2014/013480 | 1/2014 |

*Primary Examiner* — Theresa T Doan
(74) *Attorney, Agent, or Firm* — Morgan, Lewis & Bockius LLP

(57) ABSTRACT

A semiconductor package includes a first substrate, a semiconductor chip disposed on the first substrate, a mold layer disposed on the first substrate and at least partially covering the semiconductor chip, and a heat dissipation structure disposed on a first top surface of the semiconductor chip and in the mold layer. The heat dissipation structure covers an inner side surface of the mold layer. A surface roughness of the first top surface of the semiconductor chip is greater than a surface roughness of a side surface of the semiconductor chip, and a surface roughness of the inner side surface of the mold layer is greater than a surface roughness of a top surface of the mold layer. The heat dissipation structure includes voids therein.

20 Claims, 24 Drawing Sheets

(56) References Cited

U.S. PATENT DOCUMENTS

| | | |
|---|---|---|
| 6,502,767 B2 | 1/2003 | Kay et al. |
| 6,808,817 B2 | 10/2004 | Morelli et al. |
| 6,915,964 B2 | 7/2005 | Tapphorn et al. |
| 6,986,471 B1 | 1/2006 | Kowalsky et al. |
| 7,081,376 B2 | 7/2006 | Morelli et al. |
| 7,187,083 B2 | 3/2007 | Lewis et al. |
| 7,208,193 B2 | 4/2007 | Gambino et al. |
| 7,256,491 B2 | 8/2007 | Fery et al. |
| 7,654,223 B2 | 2/2010 | Kim et al. |
| 8,043,655 B2 | 10/2011 | Miller et al. |
| 8,080,278 B2 | 12/2011 | Jabado et al. |
| 8,113,025 B2 | 2/2012 | Tapphorn et al. |
| 8,252,384 B2 | 8/2012 | Jensen et al. |
| 8,338,317 B2 | 12/2012 | Engelhardt et al. |
| 8,414,977 B2 | 4/2013 | Ikejiri |
| 8,436,461 B2 | 5/2013 | Ohno |
| 8,783,584 B2 | 7/2014 | Fukanuma |
| 8,815,646 B2 | 8/2014 | Ohno |
| 8,852,681 B2 | 10/2014 | Jakimov et al. |
| 8,936,830 B2 | 1/2015 | Kim |
| 9,056,483 B1 | 6/2015 | Ahn et al. |
| 9,079,209 B2 | 7/2015 | Kim et al. |
| 9,139,912 B2 | 9/2015 | Kim et al. |
| 9,168,546 B2 | 10/2015 | Xue et al. |
| 9,414,441 B2 | 8/2016 | Takahara et al. |
| 9,433,967 B2 | 9/2016 | Nardi et al. |
| 9,561,515 B2 | 2/2017 | Richter, Jr. et al. |
| 9,653,411 B1 | 5/2017 | Lu et al. |
| 9,879,348 B2 | 1/2018 | Sun et al. |
| 9,884,369 B2 | 2/2018 | Lancaster-Larocque et al. |
| 9,978,661 B2 | 5/2018 | Im et al. |
| 10,029,476 B2 | 7/2018 | Dardona et al. |
| 10,053,765 B2 | 8/2018 | Kim et al. |
| 10,096,562 B2 | 10/2018 | Liang et al. |
| 10,177,096 B2 | 1/2019 | Min et al. |
| 10,279,441 B2 | 5/2019 | Hanamachi |
| 10,287,444 B2 | 5/2019 | Fang et al. |
| 10,350,616 B2 | 7/2019 | Hirano |
| 10,381,284 B2 | 8/2019 | Choi |
| 10,435,792 B2 | 10/2019 | Takimoto |
| 10,475,723 B1 | 11/2019 | Yeh et al. |
| 10,510,672 B2 | 12/2019 | Kim et al. |
| 10,648,086 B2 | 5/2020 | Reznik et al. |
| 10,714,671 B2 | 7/2020 | Thuss |
| 10,957,840 B2 | 3/2021 | Thuss |
| 2001/0039919 A1 | 11/2001 | Hunt et al. |
| 2002/0030971 A1* | 3/2002 | Iwasaki ............... H05K 1/0373 361/704 |
| 2006/0081174 A1 | 4/2006 | Baran |
| 2006/0121187 A1 | 6/2006 | Haynes et al. |
| 2008/0029882 A1 | 2/2008 | Fery et al. |
| 2009/0214772 A1 | 8/2009 | Ahn et al. |
| 2010/0019058 A1 | 1/2010 | Vanderzwet et al. |
| 2010/0143700 A1 | 6/2010 | Champagne et al. |
| 2014/0370203 A1 | 12/2014 | Saler et al. |
| 2014/0374901 A1* | 12/2014 | Huishu ................. H01L 23/60 257/737 |
| 2016/0021788 A1 | 1/2016 | Chauhan et al. |
| 2016/0024633 A1 | 1/2016 | Xue et al. |
| 2018/0024242 A1 | 1/2018 | Matsukawa et al. |
| 2018/0269126 A1 | 9/2018 | Im et al. |
| 2019/0249940 A1 | 8/2019 | Que |
| 2019/0300999 A1 | 10/2019 | Yamaguchi |
| 2019/0357346 A1 | 11/2019 | Lian et al. |
| 2019/0390349 A1 | 12/2019 | Whittle et al. |
| 2020/0027811 A1 | 1/2020 | Eid et al. |
| 2020/0027812 A1 | 1/2020 | Eid et al. |
| 2020/0047288 A1 | 2/2020 | Schiffries et al. |
| 2020/0049418 A1 | 2/2020 | Schiffres et al. |
| 2020/0066655 A1 | 2/2020 | Eid et al. |
| 2020/0147883 A1 | 5/2020 | Kennedy et al. |
| 2020/0194334 A1 | 6/2020 | Robinson et al. |
| 2020/0227312 A1 | 7/2020 | Escher-Poeppel et al. |
| 2020/0227336 A1 | 7/2020 | Eid |
| 2020/0312782 A1 | 10/2020 | Eid et al. |
| 2020/0321265 A1 | 10/2020 | Bellus et al. |
| 2020/0335410 A1 | 10/2020 | Chen et al. |
| 2021/0154740 A1 | 5/2021 | Senderos et al. |
| 2021/0238750 A1 | 8/2021 | Irissou et al. |

* cited by examiner

SEMICONDUCTOR PACKAGE INCLUDING A HEAT DISSIPATION STRUCTURE

CROSS-REFERENCE TO RELATED APPLICATIONS

This U.S. non-provisional patent application claims priority under 35 U.S.C. § 119 to Korean Patent Application No. 10-2021-0165882, filed on Nov. 26, 2021, in the Korean Intellectual Property Office, the entire contents of which are hereby incorporated by reference.

TECHNICAL FIELD

The present disclosure relates to a semiconductor package, and in particular, to a semiconductor package including a heat dissipation structure.

DISCUSSION OF THE RELATED ART

Integrated circuits are generally disposed within a semiconductor package so that the integrated circuits may be protected from damage and more easily connected within electronic devices. Since the semiconductor package is formed of various materials, semiconductor packages may be prone to warping as the various materials undergo thermal expansion differently. This warpage issue may lead to a failure in a process of fabricating or using the semiconductor package. Thus, deterioration of thermal and electric characteristics of the semiconductor package may be prevented or suppressed in various environments.

SUMMARY

A semiconductor package includes a first substrate, a semiconductor chip disposed on the first substrate, a mold layer disposed on the first substrate and at least partially covering the semiconductor chip, and a heat dissipation structure disposed on a first top surface of the semiconductor chip and in the mold layer. The heat dissipation structure at least partially covers an inner side surface of the mold layer. A surface roughness of the first top surface of the semiconductor chip is greater than a surface roughness of a side surface of the semiconductor chip, and a surface roughness of the inner side surface of the mold layer is greater than a surface roughness of a top surface of the mold layer. The heat dissipation structure includes voids disposed therein.

A semiconductor package includes a first substrate, a semiconductor chip disposed on the first substrate, a conductive structure disposed on the first substrate and laterally spaced apart from the semiconductor chip, a mold layer disposed on the first substrate and covering a side surface of the conductive structure and the semiconductor chip, a second substrate disposed on the conductive structure and the mold layer, and a heat dissipation structure disposed in the mold layer and the second substrate and covering a top surface of the semiconductor chip. The heat dissipation structure include protruding portions. The protruding portions are in contact with the top surface of the semiconductor chip, an inner side surface of the mold layer, and an inner side surface of the second substrate. The heat dissipation structure includes voids disposed therein.

A semiconductor package includes a first substrate including a first insulating layer and first conductive patterns, solder balls disposed on a bottom surface of the first substrate, a semiconductor chip disposed on a top surface of the first substrate, a mold layer disposed on the top surface of the first substrate and covering the semiconductor chip, and a heat dissipation structure disposed on a top surface of the semiconductor chip and in the mold layer. A thermal conductivity of the heat dissipation structure is greater than a thermal conductivity of the mold layer, and the heat dissipation structure includes first protruding portions. The first protruding portions are in contact with the top surface of the semiconductor chip and an inner side surface of the mold layer, and the heat dissipation structure includes voids disposed therein.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1A:
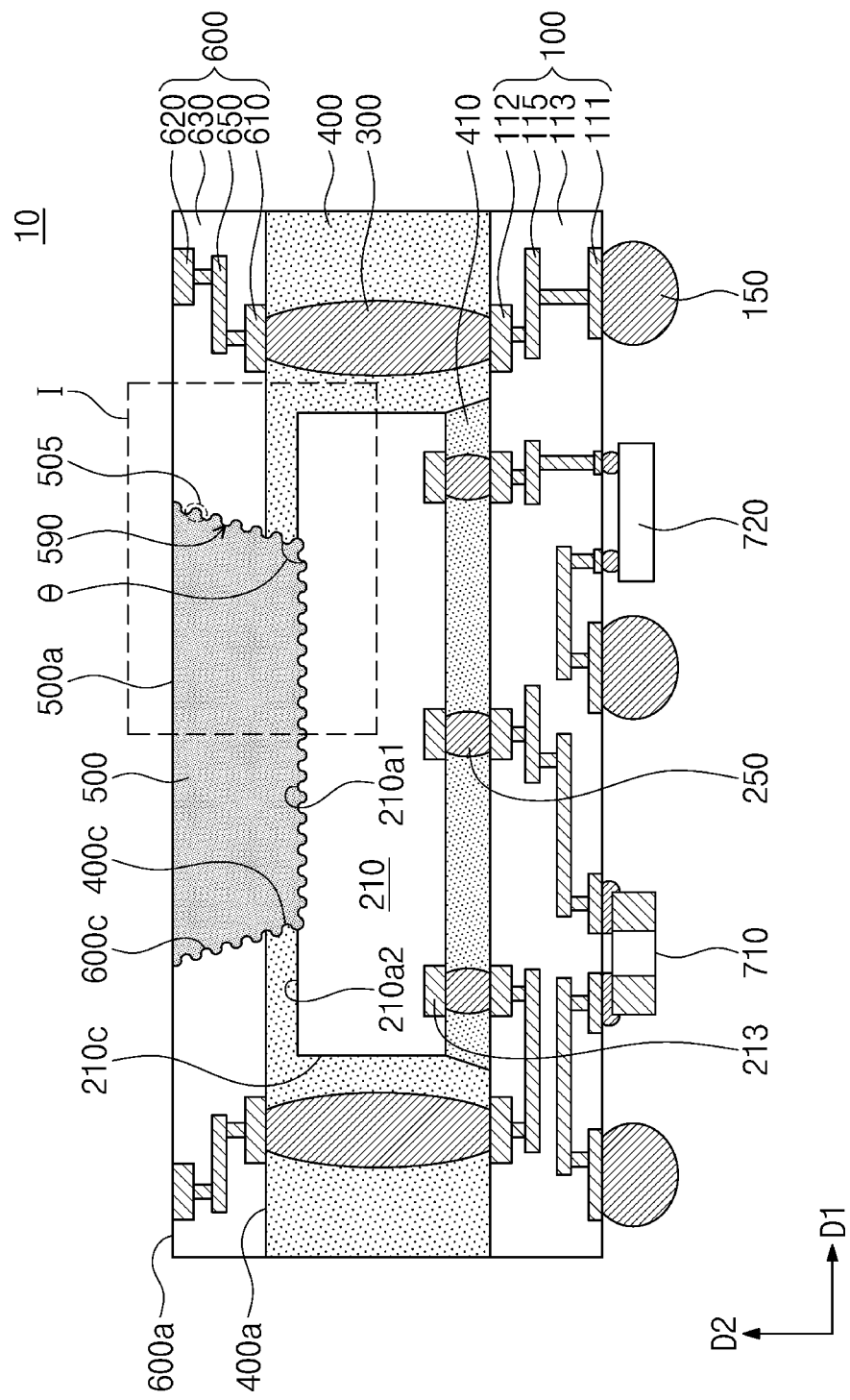
FIG. 1A is a cross-sectional view illustrating a semiconductor package according to an embodiment of the inventive concept.

Example embodiments of the inventive concepts will now be described more fully with reference to the accompanying drawings. Like reference numerals in the drawings and specification may denote like elements, and thus to the extent that a description of one or more elements has been omitted, it may be assumed that these elements are at least similar to corresponding elements that have been described elsewhere within the specification.

Figure 1B:
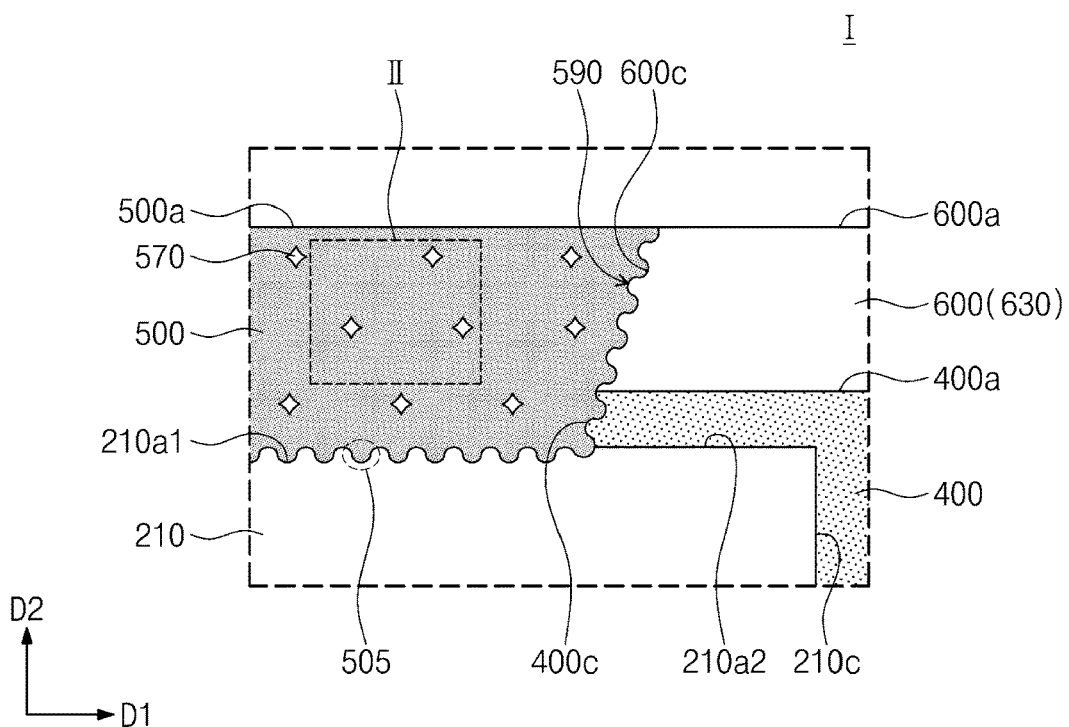
FIG. 1B is an enlarged cross-sectional view illustrating a portion I of FIG. 1A.

FIG. 1A is a cross-sectional view illustrating a semiconductor package according to an embodiment of the inventive concept. FIG. 1B is an enlarged cross-sectional view illustrating a portion I of FIG. 1A.

Referring to FIGS. 1A and 1B, a semiconductor package 10 may include a first substrate 100, a first semiconductor chip 210, a mold layer 400, and a heat dissipation structure 500. The semiconductor package 10 may further include a conductive structure 300 and a second substrate 600. The semiconductor package 10 may be disposed a lower semiconductor package.

The first substrate 100 may be a printed circuit board (PCB) or a re-distribution layer. The first substrate 100 may include a first insulating layer 113, first lower pads 111, first conductive patterns 115, and first upper pads 112. The first insulating layer 113 may include a plurality of layers. The first lower pads 111 and the first upper pads 112 may be disposed on a bottom surface and a top surface of the first substrate 100, respectively. The first conductive patterns 115 may be disposed in the first substrate 100. The first upper pads 112 may be coupled to the first lower pads 111 through the first conductive patterns 115. The expression "two elements are electrically connected or coupled to each other" may mean that the elements are directly connected or coupled to each other or are indirectly connected or coupled to each other through other conductive elements. In the present specification, an expression "an element is electrically connected to the first substrate 100" may mean that the element is electrically connected to the first conductive patterns 115. The first lower pads 111, the first conductive patterns 115, and the first upper pads 112 may be formed of or may otherwise include a metallic material (e.g., aluminum, copper, tungsten, and/or titanium).

The semiconductor package may further include solder balls 150. The solder balls 150 may be disposed on the bottom surface of the first substrate 100 and may be coupled to the first lower pads 111. External electrical signals may be transmitted to the first substrate 100 through the solder balls 150. The solder balls 150 may be formed of or may otherwise include a metallic material (e.g., solder materials). The solder material may include tin (Sn), silver (Ag), zinc (Zn), and/or alloys thereof.

The first semiconductor chip 210 may be mounted on the first substrate 100. The first semiconductor chip 210 may be a logic chip, a memory chip, or a buffer chip. The first semiconductor chip 210 may include a semiconductor substrate, first integrated circuits, and first chip pads 213. The semiconductor substrate may include a silicon substrate. The first integrated circuits may be disposed in the first semiconductor chip 210. The first chip pads 213 may be disposed on a bottom surface of the first semiconductor chip 210 and may be coupled to the first integrated circuits. In the present specification, the expression "an element is electrically connected to a semiconductor chip" may mean that the element is electrically connected to integrated circuits in the semiconductor chip through chip pads. The first semiconductor chip 210 may have a first top surface 210a1 and a second top surface 210a2.

Conductive bumps 250 may be interposed between the first substrate 100 and the first semiconductor chip 210 and may be electrically connected to the first upper pads 112 and the first chip pads 213. The conductive bumps 250 may include solder balls and/or solder pillar. The conductive bumps 250 may be formed of or may otherwise include a conductive material (e.g., solder materials). As an example, the first semiconductor chip 210 may be mounted on the first substrate 100 by a thermo compression bonding method. In this case, the first semiconductor chip 210 may be in direct contact with the first substrate 100, and the first chip pads 213 may be directly coupled to the first upper pads 112, respectively.

A first under-fill layer 410 may be interposed between the first substrate 100 and the first semiconductor chip 210 to hermetically seal the conductive bumps 250. The first under-fill layer 410 may be formed of or may otherwise include an insulating polymer.

The conductive structure 300 may be disposed on a top surface of an edge region of the first substrate 100. The conductive structure 300 may be laterally spaced apart from the first semiconductor chip 210. As used herein, two elements that are laterally spaced apart from each other may be horizontally spaced apart from each other. The term "horizontal" or "horizontally" will be used to refer to a direction that is substantially parallel to the top surface of the first substrate 100. For example, a first direction D1 may be one of such horizontal directions. The term "vertical" or "vertically" will be used to refer to a direction that is substantially perpendicular to the top surface of the first substrate 100. For example, a second direction D2 may be one of such vertical directions.

The conductive structure 300 may include a plurality of conductive structures 300, which are laterally spaced apart from each other. The conductive structures 300 may be respectively disposed on and electrically connected to the first upper pads 112. The conductive structures 300 may be electrically connected to the first semiconductor chip 210 or the solder balls 150 through the first substrate 100. The conductive structures 300 may include solder balls, conductive pillars, or combinations thereof. The conductive structures 300 may be formed of or may otherwise include a conductive material (e.g., solder materials or metallic materials).

The mold layer 400 may be disposed on the first substrate 100 and may at least partially cover the first semiconductor chip 210. For example, the mold layer 400 may at least partially cover a side surface 210c and a second top surface 210a2 of the first semiconductor chip 210. The mold layer 400 may cover side surfaces of the conductive structures 300 with top surfaces of the conductive structures 300 left exposed. As an example, the under-fill layer may be omitted, and the mold layer 400 may be extended to a region under the bottom surface of the first semiconductor chip 210 and may at least partially cover the conductive bumps 250. The mold layer 400 may be formed of or may otherwise include an insulating polymer (e.g., epoxy-based molding compound (EMC)).

The second substrate 600 may be disposed on the top surfaces of the conductive structures 300 and a top surface 400a of the mold layer 400. The second substrate 600 may be electrically connected to the conductive structures 300. The second substrate 600 may be an interposer substrate or a re-distribution layer.

The second substrate 600 may include a second insulating layer 630, second lower pads 610, second conductive patterns 650, and second upper pads 620. The second insulating layer 630 may include a plurality of layers. The second insulating layer 630 may be formed of or may otherwise include an insulating resin (e.g., solder resist materials). The second insulating layer 630 may have a relatively low thermal conductivity.

The second lower pads 610 may be disposed on a bottom surface of the second substrate 600. The second lower pads 610 may be coupled to the conductive structures 300, respectively. The second conductive patterns 650 may be disposed in the second insulating layer 630 and may be coupled to the second lower pads 610. The second upper pads 620 may be disposed on a top surface 600a of the second substrate 600. The second upper pads 620 may be electrically connected to the second lower pads 610 through the second conductive patterns 650. At least one of the second upper pads 620 might not be vertically overlapped with the second lower pad 610 electrically connected thereto. The arrangement and number of the second upper pads 620 might not necessarily be limited to those of the conductive structures 300 and may be freely designed. The second lower pads 610, the second conductive patterns 650, and the second upper pads 620 may be formed of or may otherwise include a metallic material (e.g., copper). An electric connection with the second substrate 600 may include an electric connection with the second conductive patterns 650.

The heat dissipation structure 500 may be disposed on the first top surface 210a1 of the first semiconductor chip 210 and may at least partially cover the first top surface 210a1 of the first semiconductor chip 210. The second top surface 210a2 of the first semiconductor chip 210 may be spaced apart from the heat dissipation structure 500. The heat dissipation structure 500 may be disposed in the first substrate 100 and the mold layer 400. For example, the heat dissipation structure 500 may be disposed in an opening 590. The opening 590 may be disposed to penetrate the mold layer 400 and the second substrate 600 and may expose the first top surface 210a1 of the first semiconductor chip 210. The opening 590 may expose an inner side surface 400c of the mold layer 400 and an inner side surface 600c of the second substrate 600. The inner side surface 600c of the second substrate 600 may expose the second insulating layer 630 but not the second conductive patterns 650. Accordingly, the heat dissipation structure 500 may be spaced apart from the second conductive patterns 650 and might not be electrically connected to the second conductive patterns 650.

The heat dissipation structure 500 may be in contact with the first top surface 210a1 of the first semiconductor chip 210, the inner side surface 400c of the mold layer 400, and the inner side surface 600c of the second substrate 600. The heat dissipation structure 500 may have a plurality of first protruding portions 505. The first protruding portions 505 may be disposed on the first top surface 210a1 of the first semiconductor chip 210, the inner side surface 400c of the mold layer 400, and the inner side surface 600c of the second substrate 600. A surface roughness of the first top surface 210a1 of the first semiconductor chip 210 may be greater than a surface roughness of the side surface 210c of the first semiconductor chip 210. The surface roughness of the first top surface 210a1 of the first semiconductor chip 210 may be greater than a surface roughness of the second top surface 210a2 of the first semiconductor chip 210. As an example, the surface roughness of the first top surface 210a1 of the first semiconductor chip 210 may be equal to or smaller than the surface roughness of the second top surface 210a2 of the first semiconductor chip 210. A surface roughness of the inner side surface 400c of the mold layer 400 may be greater than a surface roughness of the top surface 400a of the mold layer 400. A surface roughness of the inner side surface 600c of the second substrate 600 may be greater than a surface roughness of the top surface 600a of the second substrate 600.

A width of a top surface 500a of the heat dissipation structure 500 may be larger than a width of a bottom surface of the heat dissipation structure 500. Here, the top surface 500a of the heat dissipation structure 500 may be externally exposed (e.g., exposed to ambient air). The top surface 500a of the heat dissipation structure 500 may be disposed at substantially the same level as the top surface 600a of the second substrate 600. As an example, the top surface 500a of the heat dissipation structure 500 may be disposed at a level different from the top surface 600a of the second substrate 600. The bottom surface of the heat dissipation structure 500 may be in contact with the first semiconductor chip 210. A side surface of the heat dissipation structure 500 may be inclined at an angle with respect to the bottom surface of the heat dissipation structure 500. For example, an angle θ between the bottom and side surfaces of the heat dissipation structure 500 may be an obtuse angle. The angle θ between the bottom and side surfaces of the heat dissipation structure 500 may be greater than 95°. For example, the angle θ between the bottom and side surfaces of the heat dissipation structure 500 may range from 95° to 120°.

The heat dissipation structure 500 may have voids 570 disposed therein. As an example, each of the voids 570 may be an empty space that is filled with the air. The voids 570 may be spaced apart from each other.

The heat dissipation structure 500 may be formed of or may otherwise include a conductive material (e.g., metallic materials). As an example, the heat dissipation structure 500 may include a silicon-containing material or silica. The heat dissipation structure 500 may be formed of or may otherwise include copper (Cu), aluminum (Al), nickel (Ni), titanium (Ti), tungsten (W), tantalum (Ta), silicon (Si), silicon carbide (SiC), oxides thereof, and/or alloys thereof. Hereinafter, the material of the heat dissipation structure 500 and the voids 570 will be described in more detail.

Figure 1C:
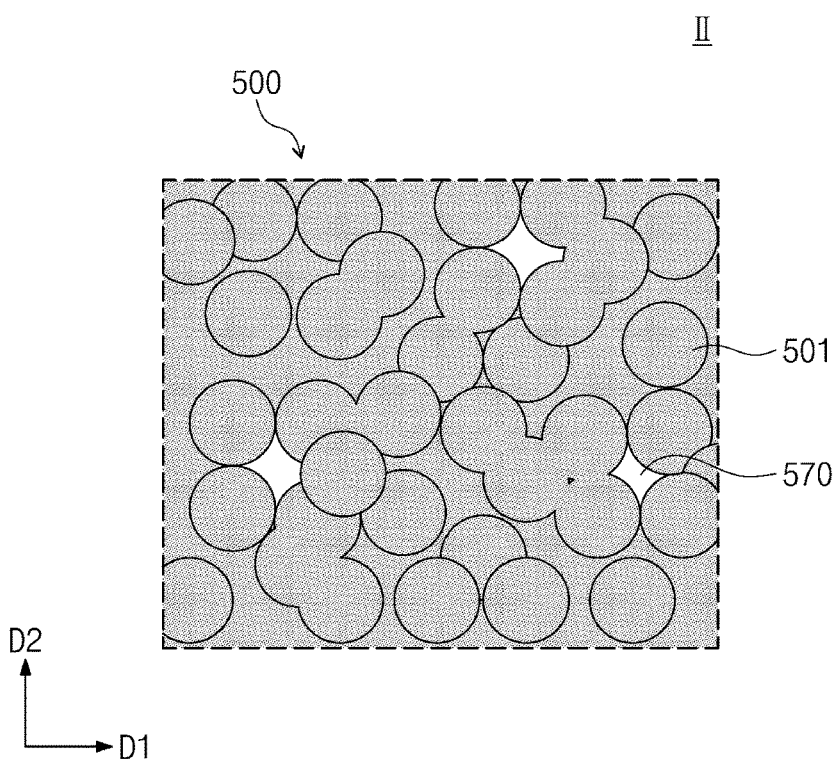
FIG. 1C is a diagram illustrating an enlarged structure of a portion II of FIG. 1B.

FIG. 1C is a diagram illustrating a heat dissipation structure according to an embodiment of the inventive concept and in particular illustrating an enlarged structure of a portion II of FIG. 1B.

Referring to FIG. 1C, the heat dissipation structure 500 may include a plurality of first particles 501. The first particles 501 may be in contact with each other and may be combined to each other. There may be no observable interface between the first particles 501, but the inventive concept is not necessarily limited to this example. The first particles 501 may be formed of or may otherwise include the same material. For example, the first particles 501 may be formed of or may otherwise include at least one of the afore-described materials (e.g., copper (Cu), aluminum (Al), nickel (Ni), titanium (Ti), tungsten (W), tantalum (Ta), silicon (Si), silicon carbide (SiC), oxides thereof, and/or alloys thereof).

The voids 570 may be disposed between the first particles 501. For example, each of the voids 570 may be an empty space between the first particles 501. It is noted, however, that only some of the first particles 501 are separated from each other by the voids 570 and so others of the first particles 501 are connected to one another.

Figure 1D:
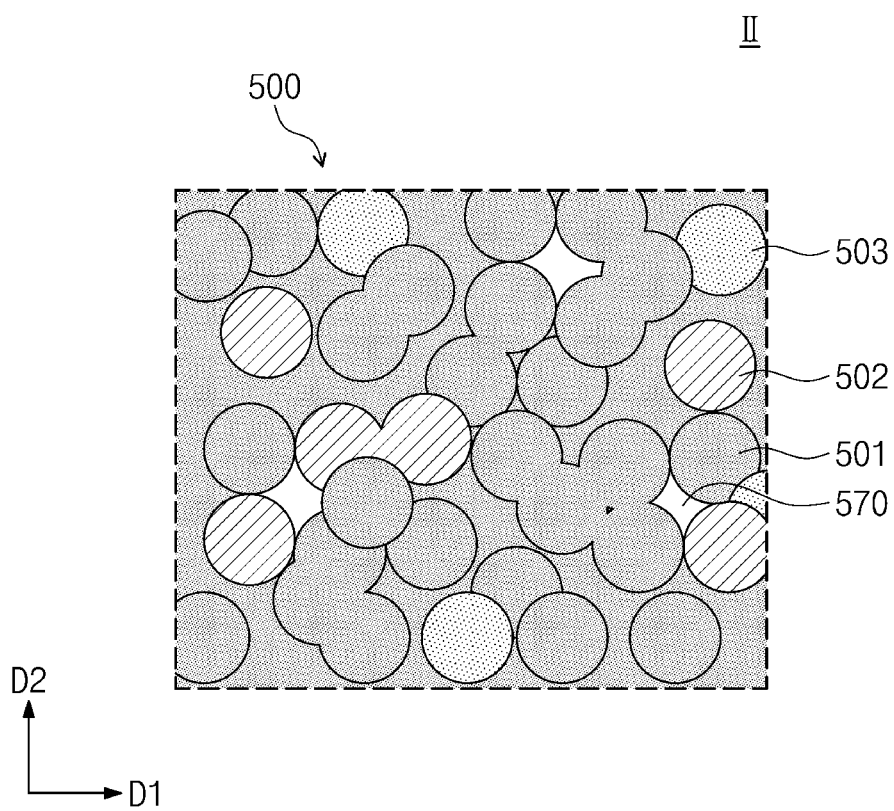
FIG. 1D is a diagram illustrating a heat dissipation structure according to an embodiment of the inventive concept.

FIG. 1D is a diagram illustrating a heat dissipation structure according to an embodiment of the inventive concept and corresponding to an enlarged structure of the portion II of FIG. 1B.

Referring to FIG. 1D, the heat dissipation structure 500 may include the first particles 501 and second particles 502. The first particles 501 may have some of the same features as those in the embodiments of FIG. 1C. For example, the first particles 501 may be in contact with each other and may be combined/connected to each other. The second particles 502 may be disposed between the first particles 501. The second particles 502 may be formed of or may otherwise include one of the afore-enumerated materials for the first particles 501. However, the second particles 502 may be formed of or may otherwise include a material different from the first particles 501. The second particles 502 may be combined/connected to each other, and an interface between the second particles 502 might not be distinguished. However, the inventive concept is not necessarily limited to this example.

The heat dissipation structure 500 may further include third particles 503. The third particles 503 may be disposed between the first particles 501. The third particles 503 may be formed of or may otherwise include a material different from the first and second particles 501 and 502. For example, the third particles 503 may be formed of or may otherwise include a material that is one of the afore-enumerated materials for the first particles 501 but is different from the materials of the first and second particles 501 and 502.

The voids 570 may be disposed between the first to third particles 501, 502, and 503.

The shapes and materials of the first to third particles 501, 502, and 503 may be variously changed. For example, the heat dissipation structure 500 may further include fourth particles, and in this case, the fourth particles may be formed of or may otherwise include a material different from the first to third particles 501, 502, and 503.

Referring back to FIGS. 1A and 1B, the heat dissipation structure 500 may have a relatively high thermal conductivity. For example, the thermal conductivity of the heat dissipation structure 500 may be higher than that of the mold layer 400. The thermal conductivity of the heat dissipation structure 500 may be higher than that of the second insulating layer 630. The thermal conductivity of the heat dissipation structure 500 may be higher than that of the semiconductor substrate of the first semiconductor chip 210. The semiconductor substrate of the first semiconductor chip 210 may be formed of or may otherwise include, for example, silicon. In an embodiment, the thermal conductivity of the heat dissipation structure 500 may range from 20 W/mK to 400 W/mK. In the case where the heat dissipation structure 500 has a thermal conductivity higher than 20 W/mK, heat, which is generated from the first semiconductor chip 210 during an operation of the semiconductor package 10, may be quickly dissipated to the outside through the heat dissipation structure 500. Accordingly, the first semiconductor chip 210 and the semiconductor package 10 therewith may have an increased ability to dissipate heat.

In the case where a differences between thermal expansion coefficients of the first semiconductor chip 210, the second substrate 600, and the mold layer 400 is excessively large, the semiconductor package may suffer a warpage issue. In an embodiment, since the heat dissipation structure 500 is used, a difference in thermal expansion coefficient between the first semiconductor chip 210, the second substrate 600, and the mold layer 400 may be reduced by the heat dissipation structure 500. For example, the thermal expansion coefficient of the heat dissipation structure 500 may be smaller than or equal to 16 ppm/K. Accordingly, a propensity for the semiconductor package to warp may be reduced.

The semiconductor package 10 may further include a first passive device 710 and/or a second passive device 720. The first passive device 710 and the second passive device 720 may be mounted on the bottom surface of the first substrate 100. The first passive device 710 and the second passive device 720 may be laterally spaced apart from each other. Electric signals or voltages, which are input through the solder balls 150, may be transferred to the first semiconductor chip 210 or the conductive structures 300 through the first and second passive devices 710 and 720. The first passive device 710 and the second passive device 720 may be of different kinds. In an embodiment, the first passive device 710 and the second passive device 720 may include a capacitor, a resistor, or an inductor. As an example, the second passive device 720 may be of the same kind as the first passive device 710.

Figure 2A:
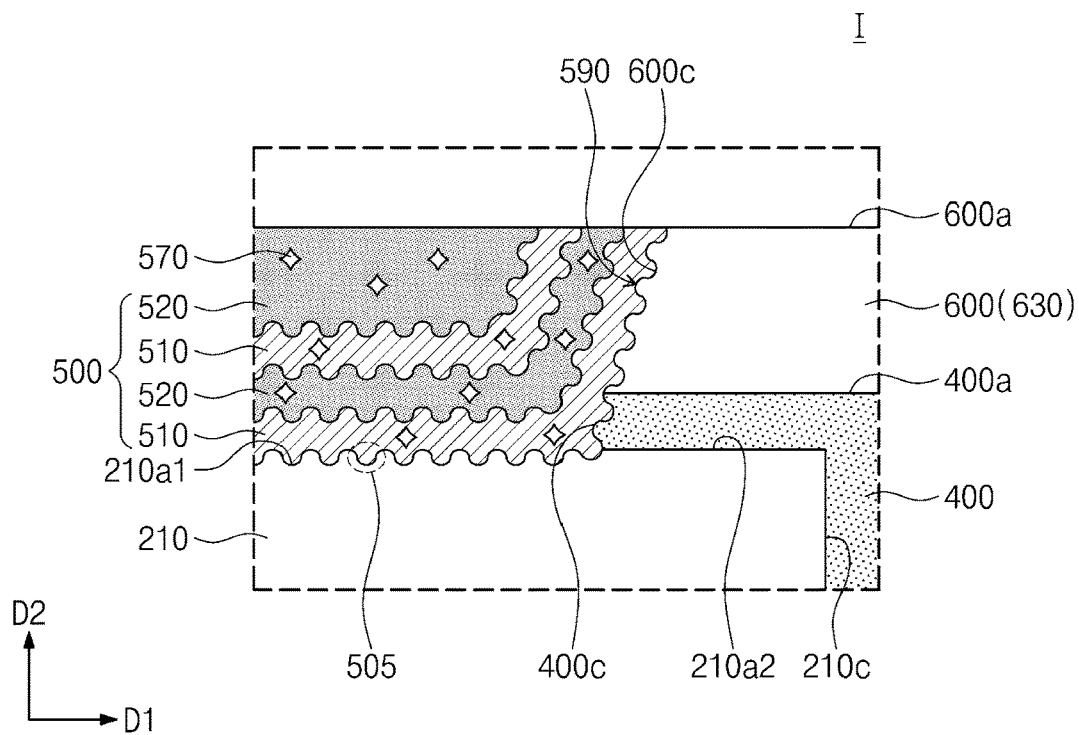
FIG. 2A is a diagram illustrating a heat dissipation structure according to an embodiment of the inventive concept.

FIG. 2A is a diagram illustrating a heat dissipation structure according to an embodiment of the inventive concept and corresponding to an enlarged structure of the portion I of FIG. 1A.

Referring to FIG. 2A, the heat dissipation structure 500 may include a first heat-dissipation layer 510 and a second heat-dissipation layer 520. The first heat-dissipation layer 510 may at least partially cover the first top surface 210a1 of the first semiconductor chip 210. A bottom surface of the first heat-dissipation layer 510 may be the bottom surface of the heat dissipation structure 500. The bottom surface of the first heat-dissipation layer 510 may have a relatively high surface roughness. For example, the surface roughness of the bottom surface of the first heat-dissipation layer 510 may be greater than the surface roughness of the side surface 210c of the first semiconductor chip 210. The first heat-dissipation layer 510 may further cover the inner side surface 400c of the mold layer 400 and the inner side surface 600c of the second substrate 600. The first heat-dissipation layer 510 may include a first material. The first material may include, for example, titanium, tantalum, nickel, aluminum, or alloys thereof. For example, the first heat-dissipation layer 510 might not include copper. The first heat-dissipation layer 510 may serve as a barrier layer. For example, the first heat-dissipation layer 510 may prevent diffusion of a second material included in the second heat-dissipation layer 520. This may make the first semiconductor chip 210 more durable. A content ratio of a mass of copper in the first heat-dissipation layer 510, relative to a total mass of the first heat-dissipation layer 510, may be smaller than a content ratio of a mass of copper in the second heat-dissipation layer 520, relative to a total mass of the second heat-dissipation layer 520. The expression "a content ratio of copper is small" may also include a case in which copper is absent.

The first heat-dissipation layer 510 may include the first particles 501 described in the embodiment of FIG. 1C. As an example, the first heat-dissipation layer 510 may include the first to third particles 501, 502, and 503 described in the embodiment of FIG. 1D.

The second heat-dissipation layer 520 may be disposed on the first heat-dissipation layer 510. A second surface of the second heat-dissipation layer 520 may have an appreciable surface roughness. The second surface of the second heat-dissipation layer 520 may be in contact with the first heat-dissipation layer 510. Alternatively, the second surface of the second heat-dissipation layer 520 may be flat (e.g., planar).

The second heat-dissipation layer 520 may include a second material. The second material may include copper (Cu), aluminum, nickel (Ni), titanium (Ti), tantalum, silicon (Si), silicon carbide (SiC), oxides thereof, and/or alloys thereof. However, the second material may be different from the first material. The second heat-dissipation layer 520 may include the first particles 501 described in the embodiment of FIG. 1C or may include one or more of the first to third particles 501, 502, and 503 described in the embodiment of FIG. 1D.

The voids 570 may be disposed in the first heat-dissipation layer 510 and the second heat-dissipation layer 520. As an example, the first heat-dissipation layer 510 and/or the second heat-dissipation layer 520 might not include the voids 570.

The heat dissipation structure 500 may include a plurality of first heat-dissipation layers 510 and a plurality of second heat-dissipation layers 520. The first heat-dissipation layers 510 and the second heat-dissipation layers 520 may be repeatedly and alternately stacked. The numbers of the first and second heat-dissipation layers 510 and 520 in the heat dissipation structure 500 may be variously changed. As an example, the heat dissipation structure 500 may include one first heat-dissipation layer 510 and one second heat-dissipation layer 520. For example, the heat dissipation structure 500 may have a double-layered structure.

Figure 2B:
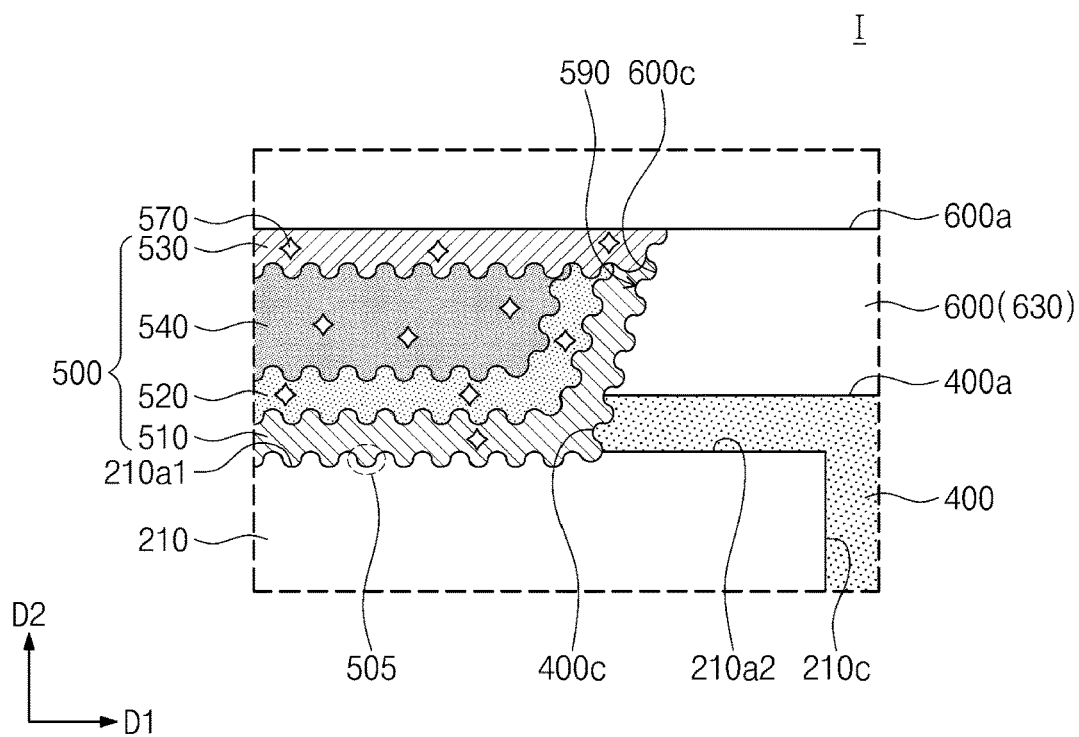
FIG. 2B is a diagram illustrating a heat dissipation structure according to an embodiment of the inventive concept.

FIG. 2B is a diagram illustrating a heat dissipation structure, according to an embodiment of the inventive concept, and corresponding to an enlarged structure of the portion I of FIG. 1A.

Referring to FIG. 2B, the heat dissipation structure 500 may include the first heat-dissipation layer 510, the second heat-dissipation layer 520, and a third heat-dissipation layer 530. The first heat-dissipation layer 510 and the second heat-dissipation layer 520 may be substantially the same as those in the embodiment of FIG. 2A. The first heat-dissipation layer 510 may be configured to prevent diffusion of the second material, which is included in the second heat-dissipation layer 520, or diffusion of a third material, which is included in the third heat-dissipation layer 530.

The third heat-dissipation layer 530 may be disposed on the second heat-dissipation layer 520. The third heat-dissipation layer 530 may extend to a region on the first heat-dissipation layer 510. A top surface of the third heat-dissipation layer 530 may be exposed to external air. For example, the top surface of the third heat-dissipation layer 530 may be exposed to a region on the top surface 400a of the mold layer 400 or the top surface 600a of the second substrate 600. The third heat-dissipation layer 530 may be a protection layer or an oxidation prevention layer. For example, the third heat-dissipation layer 530 may prevent the first heat-dissipation layer 510 or the second heat-dissipation layer 520 from being damaged (e.g., oxidized).

A content ratio of copper in the third heat-dissipation layer 530 (with respect to the entirety, by mass) may be smaller than a content ratio of copper in the second heat-dissipation layer 520 (with respect to the entirety, by mass). The expression "a content ratio of copper is small" may mean a case in which copper is absent. The third heat-dissipation layer 530 may include a third material. The third material may be different from the second material. The third material may be the same as or different from the first material included in the first heat-dissipation layer 510. For example, the third material may include aluminum (Al), nickel (Ni), titanium (Ti), tantalum, silicon (Si), silicon carbide (SiC), oxides thereof, and/or alloys thereof. The third heat-dissipation layer 530 might not include copper. The third heat-dissipation layer 530 may include the first particles 501 described in the embodiment of FIG. 1C or may include one or more of the first to third particles 501, 502, and 503 described in the embodiment of FIG. 1D.

The heat dissipation structure 500 may further include a fourth heat-dissipation layer 540. The fourth heat-dissipation layer 540 may be disposed between the second heat-dissipation layer 520 and the third heat-dissipation layer 530. The third heat-dissipation layer 530 may further cover a top surface of the fourth heat-dissipation layer 540. As an example, the fourth heat-dissipation layer 540 may be formed of or may otherwise include a fourth material that is different from the first material and the third material. The fourth material may include copper (Cu), aluminum (Al), nickel (Ni), titanium (Ti), tungsten (W), tantalum (Ta), tantalum, silicon (Si), silicon carbide (SiC), oxides thereof, and/or alloys thereof. A content ratio of copper in the fourth heat-dissipation layer 540 may be equal to or higher than a content ratio of copper in the first heat-dissipation layer 510 and a content ratio of copper in the third heat-dissipation layer 530. The fourth heat-dissipation layer 540 may include the first particles 501 described in the embodiment of FIG. 1C or may include one or more of the first to third particles 501, 502, and 503 described in the embodiment of FIG. 1D.

The number of the stacked heat-dissipation layers (e.g., 510, 520, 530, and 540) may be variously changed. As an example the first heat-dissipation layer 510, the second heat-dissipation layer 520, the third heat-dissipation layer 530, and/or the fourth heat-dissipation layer 540 may be omitted. As an example, a fifth heat-dissipation layer may be further disposed between the second heat-dissipation layer 520 and the fourth heat-dissipation layer 540. As other example, at least two layers of the first heat-dissipation layer 510, the second heat-dissipation layer 520, the third heat-dissipation layer 530, and the fourth heat-dissipation layer 540 may be repeatedly stacked.

Each of a first surface of the first heat-dissipation layer 510, the second surface of the second heat-dissipation layer 520, and a third surface of the third heat-dissipation layer 530 may have a specific surface roughness. The second surface of the second heat-dissipation layer 520 may be in contact with the fourth heat-dissipation layer 540. The third surface of the third heat-dissipation layer 530 may be in contact with the fourth heat-dissipation layer 540. The third surface of the third heat-dissipation layer 530 may be a bottom surface of the third heat-dissipation layer 530. As an example, the first surface of the first heat-dissipation layer 510, the second surface of the second heat-dissipation layer 520, and/or the third surface of the third heat-dissipation layer 530 may be flat.

The voids 570 may be disposed in the first heat-dissipation layer 510, the second heat-dissipation layer 520, the third heat-dissipation layer 530, and/or the fourth heat-dissipation layer 540. As an example, the voids 570 may be disposed in the first heat-dissipation layer 510, the second heat-dissipation layer 520, the third heat-dissipation layer 530, and the fourth heat-dissipation layer 540. As an example, the first heat-dissipation layer 510, the second heat-dissipation layer 520, the third heat-dissipation layer 530, and/or the fourth heat-dissipation layer 540 might not include the voids 570.

Figure 2C:
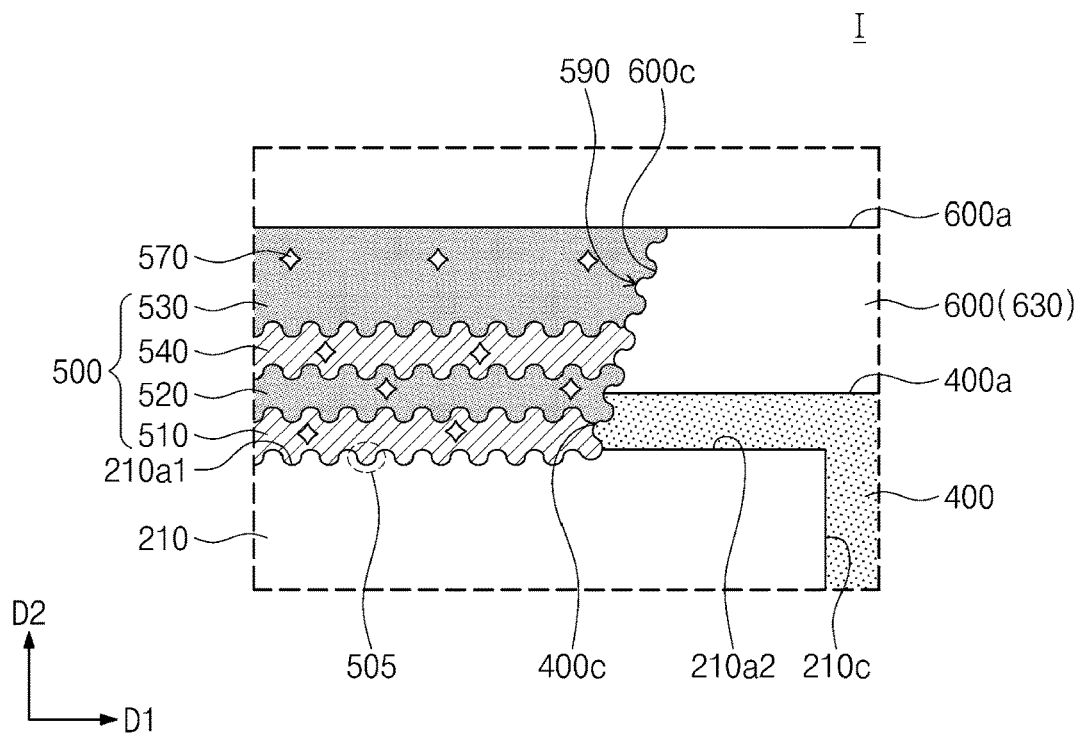
FIG. 2C is a diagram illustrating a heat dissipation structure according to an embodiment of the inventive concept.

FIG. 2C is a diagram illustrating a heat dissipation structure, according to an embodiment of the inventive concept, and corresponding to an enlarged structure of the portion I of FIG. 1A.

Referring to FIG. 2C, the heat dissipation structure 500 may include the first heat-dissipation layer 510, the second heat-dissipation layer 520, the third heat-dissipation layer 530, and the fourth heat-dissipation layer 540. The first heat-dissipation layer 510, the second heat-dissipation layer 520, the third heat-dissipation layer 530, and the fourth heat-dissipation layer 540 may be substantially the same as those in the embodiment of FIG. 2A or the embodiment of FIG. 2B. However, the first heat-dissipation layer 510 might not be extended to the inner side surface 600c of the second substrate 600. The second heat-dissipation layer 520 and the third heat-dissipation layer 530 might not be extended to an upper portion of the inner side surface 600c of the second substrate 600. The shapes of the first heat-dissipation layer 510, the second heat-dissipation layer 520, the third heat-dissipation layer 530, and the fourth heat-dissipation layer 540 may be variously changed.

Figure 2D:
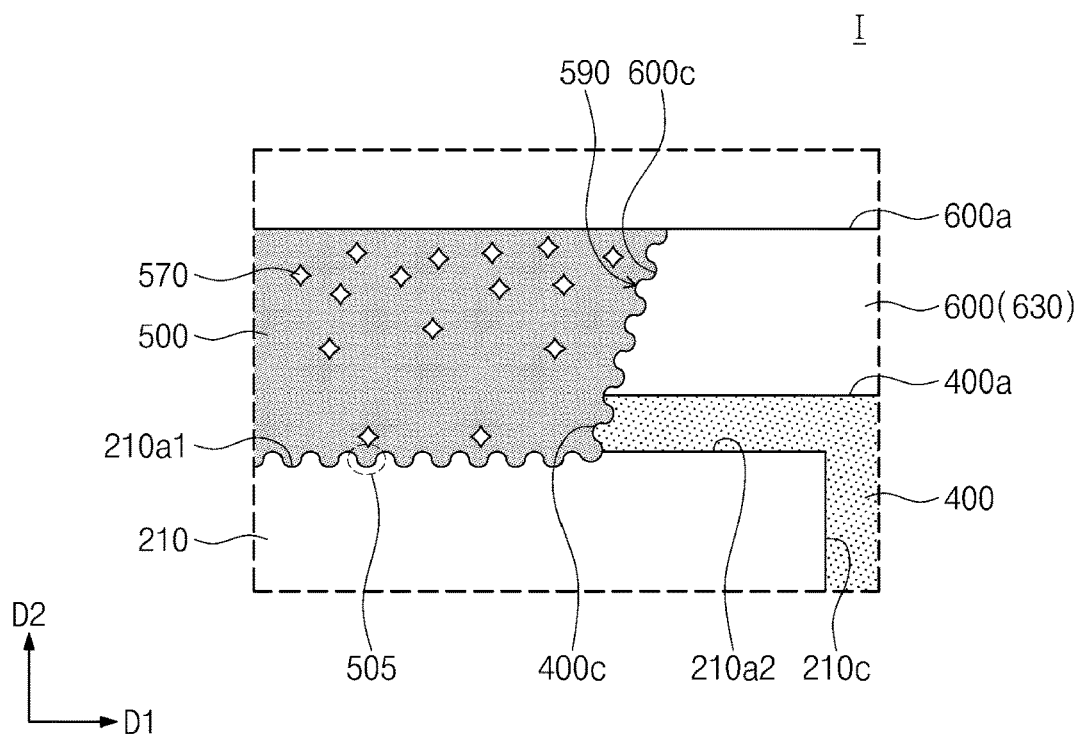
FIG. 2D is a diagram illustrating a heat dissipation structure according to an embodiment of the inventive concept.

FIG. 2D is a diagram illustrating a heat dissipation structure according to an embodiment of the inventive concept and corresponding to an enlarged structure of the portion I of FIG. 1A.

Referring to FIG. 2D, the heat dissipation structure 500 may include a lower portion and an upper portion. The lower portion of the heat dissipation structure 500 may be interposed between the upper portion thereof and the first semiconductor chip 210. The heat dissipation structure 500 may have the voids 570. A sum of areas of the voids 570 per unit area in the upper portion of the heat dissipation structure 500 may be larger than a sum of areas of the voids 570 per unit area in the lower portion of the heat dissipation structure 500. For example, the number of the voids 570 per unit area in the upper portion of the heat dissipation structure 500 may be greater than the number of the voids 570 per unit area in the lower portion of the heat dissipation structure 500. A mean area of the voids 570 in the upper portion of the heat dissipation structure 500 may be larger than a mean area of the voids 570 in the lower portion of the heat dissipation structure 500. Unlike the illustrated structure, the voids 570 may be disposed in the upper portion of the heat dissipation structure 500 but might not be disposed in the lower portion of the heat dissipation structure 500.

Figure 2E:
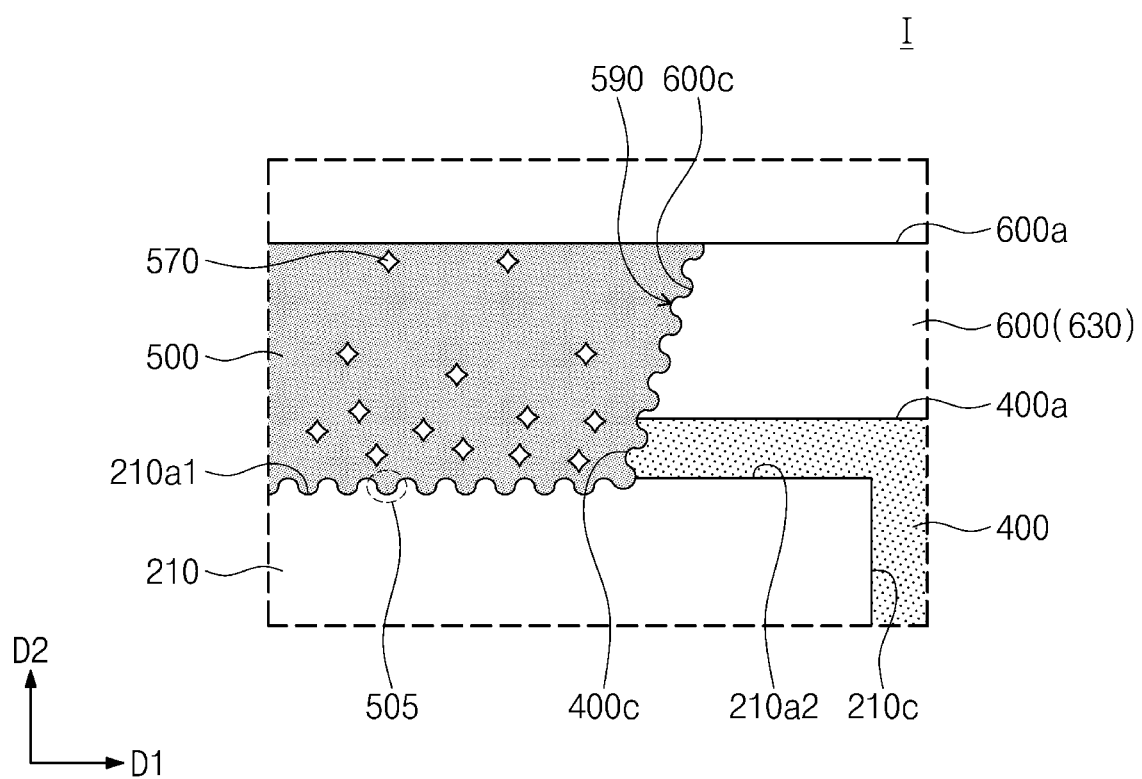
FIG. 2E is a diagram illustrating a heat dissipation structure according to an embodiment of the inventive concept.

FIG. 2E is a diagram illustrating a heat dissipation structure according to an embodiment of the inventive concept and corresponding to an enlarged structure of the portion I of FIG. 1A.

Referring to FIG. 2E, a sum of areas of the voids 570 per unit area in the lower portion of the heat dissipation structure 500 may be larger than a sum of areas of the voids 570 per unit area in the upper portion of the heat dissipation structure 500. For example, the number of the voids 570 per unit area in the lower portion of the heat dissipation structure 500 may be greater than the number of the voids 570 per unit area in the upper portion of the heat dissipation structure 500. A mean area of the voids 570 in the lower portion of the heat dissipation structure 500 may be larger than a mean area of the voids 570 in the upper portion of the heat dissipation structure 500.

Unlike the illustrated structure, the voids 570 may be disposed in the lower portion of the heat dissipation structure 500 but might not be disposed in the upper portion of the heat dissipation structure 500.

Figure 3A:
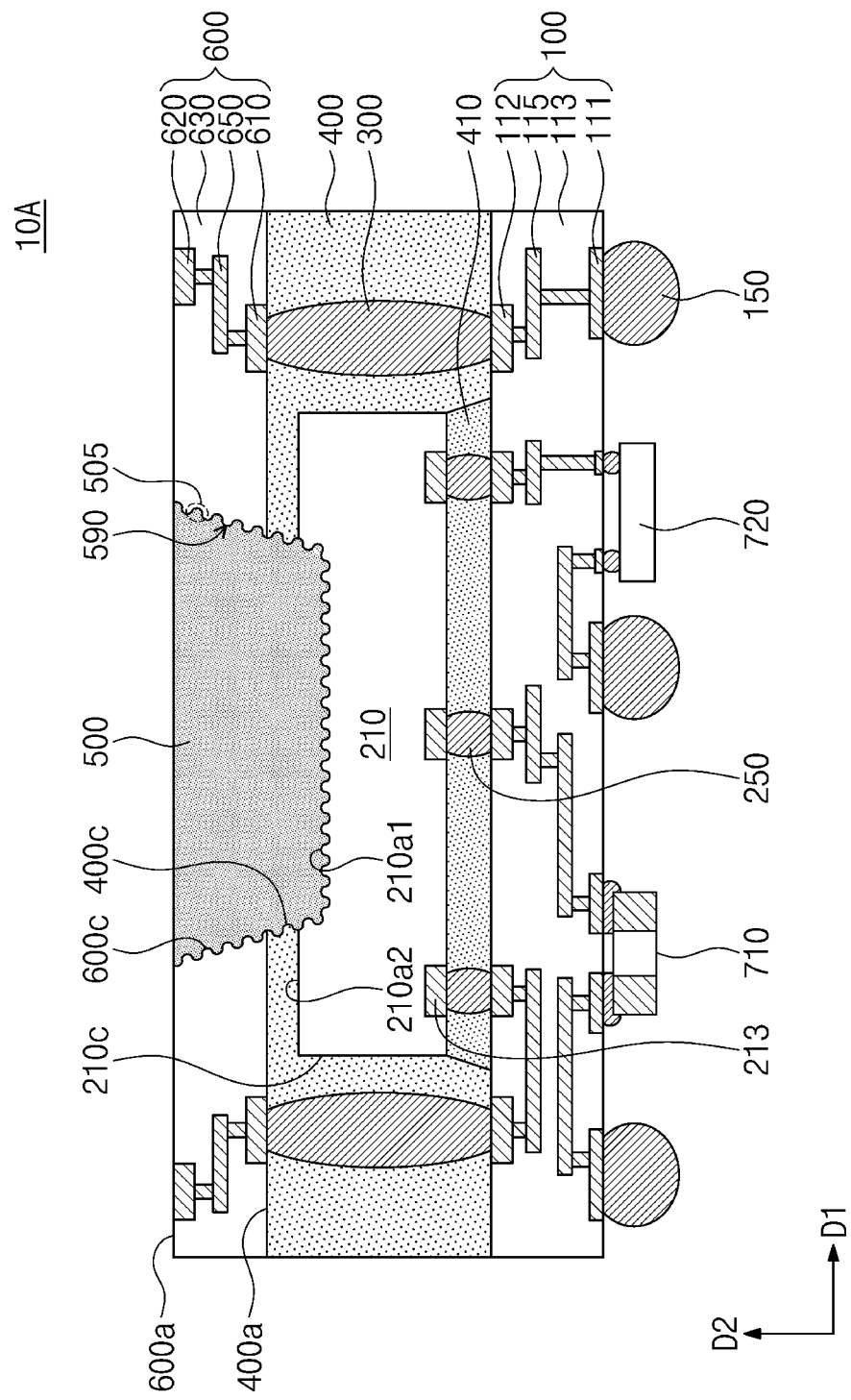
FIG. 3A is a diagram illustrating a semiconductor package according to an embodiment of the inventive concept.

FIG. 3A is a diagram illustrating a semiconductor package according to an embodiment of the inventive concept.

Referring to FIG. 3A, the semiconductor package 10A may include the first substrate 100, the solder balls 150, the first semiconductor chip 210, the mold layer 400, the conductive structures 300, the second substrate 600, and the heat dissipation structure 500.

The opening 590 may be further extended into the first semiconductor chip 210. For example, a bottom surface of the opening 590 may be disposed at a level that is lower than the second top surface 210a2 of the first semiconductor chip 210. The uppermost portion of the first top surface 210a1 of the first semiconductor chip 210 may be disposed at a level that is lower than the second top surface 210a2. Thus, the heat dissipation structure 500 may be further disposed in the first semiconductor chip 210. The bottom surface of the heat dissipation structure 500 may be disposed at a level that is lower than the second top surface 210a2 of the first semiconductor chip 210.

Figure 3B:
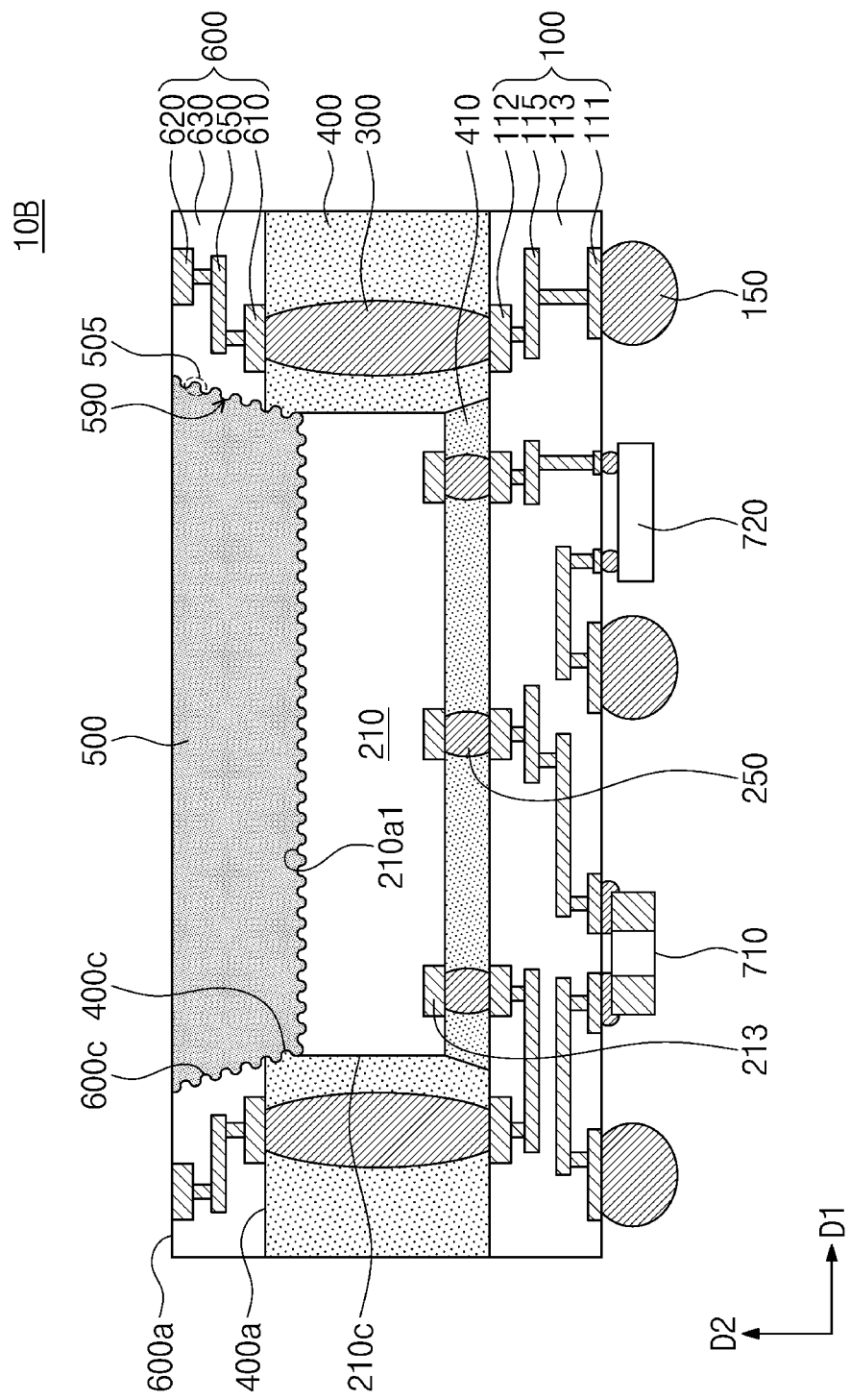
FIG. 3B is a diagram illustrating a semiconductor package according to an embodiment of the inventive concept.

FIG. 3B is a diagram illustrating a semiconductor package according to an embodiment of the inventive concept.

Referring to FIG. 3B, the semiconductor package 10B may include the first substrate 100, the solder balls 150, the first semiconductor chip 210, the mold layer 400, the conductive structures 300, the second substrate 600, and the heat dissipation structure 500. A width of the bottom surface of the heat dissipation structure 500 may be equal to or larger than a width of the first semiconductor chip 210. The first semiconductor chip 210 may have the first top surface 210a1 but might not have the second top surface 210a2. For example, a top surface of the first semiconductor chip 210 might not be in contact with the mold layer 400.

Figure 3C:
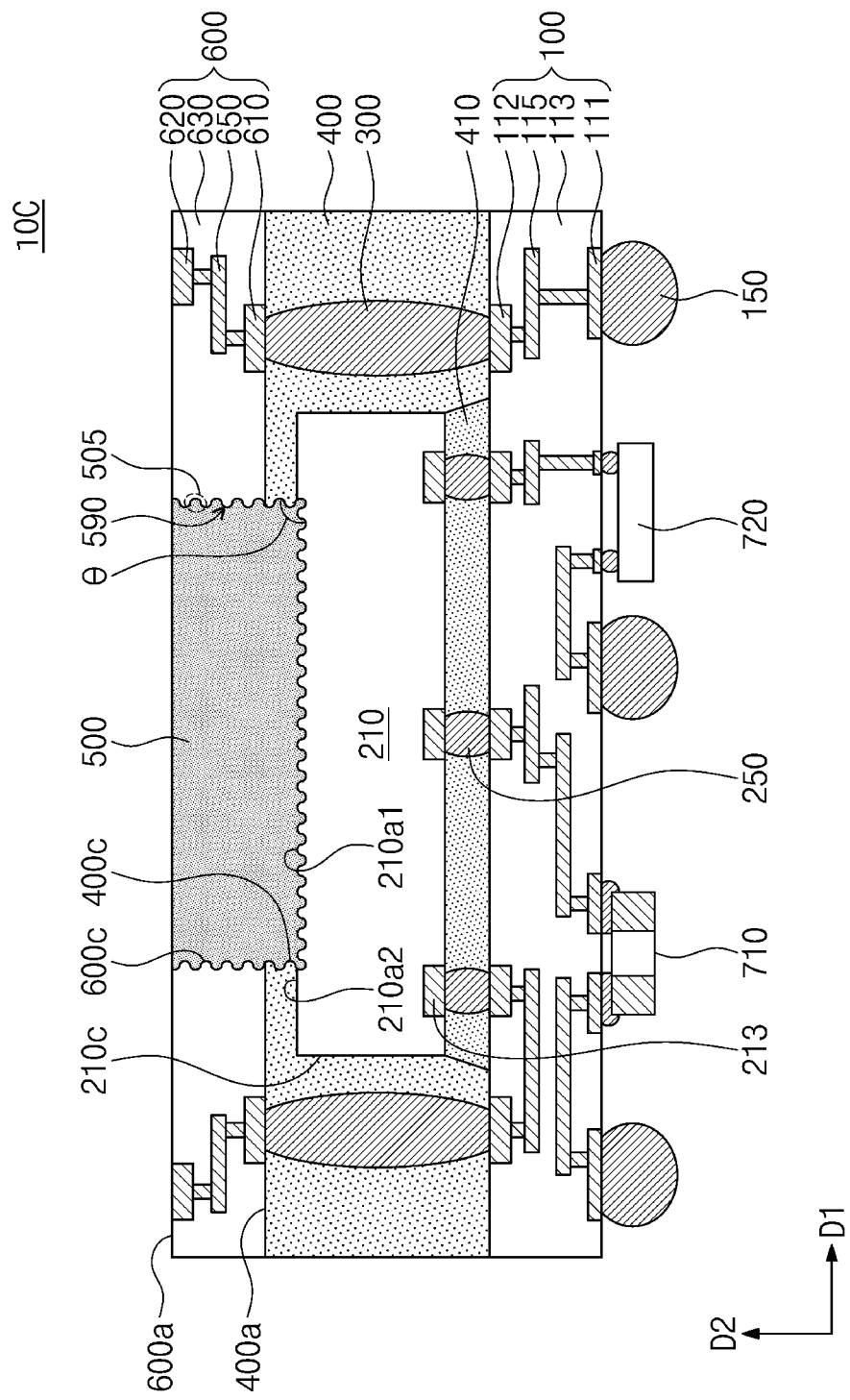
FIG. 3C is a diagram illustrating a semiconductor package according to an embodiment of the inventive concept.

FIG. 3C is a diagram illustrating a semiconductor package according to an embodiment of the inventive concept.

Referring to FIG. 3C, the semiconductor package 10C may include the first substrate 100, the solder balls 150, the first semiconductor chip 210, the mold layer 400, the conductive structures 300, the second substrate 600, and the heat dissipation structure 500. The side surface of the heat dissipation structure 500 may be substantially perpendicular to the bottom surface thereof. The angle θ between the bottom and side surfaces of the heat dissipation structure 500 may be about 90°.

Figure 3D:
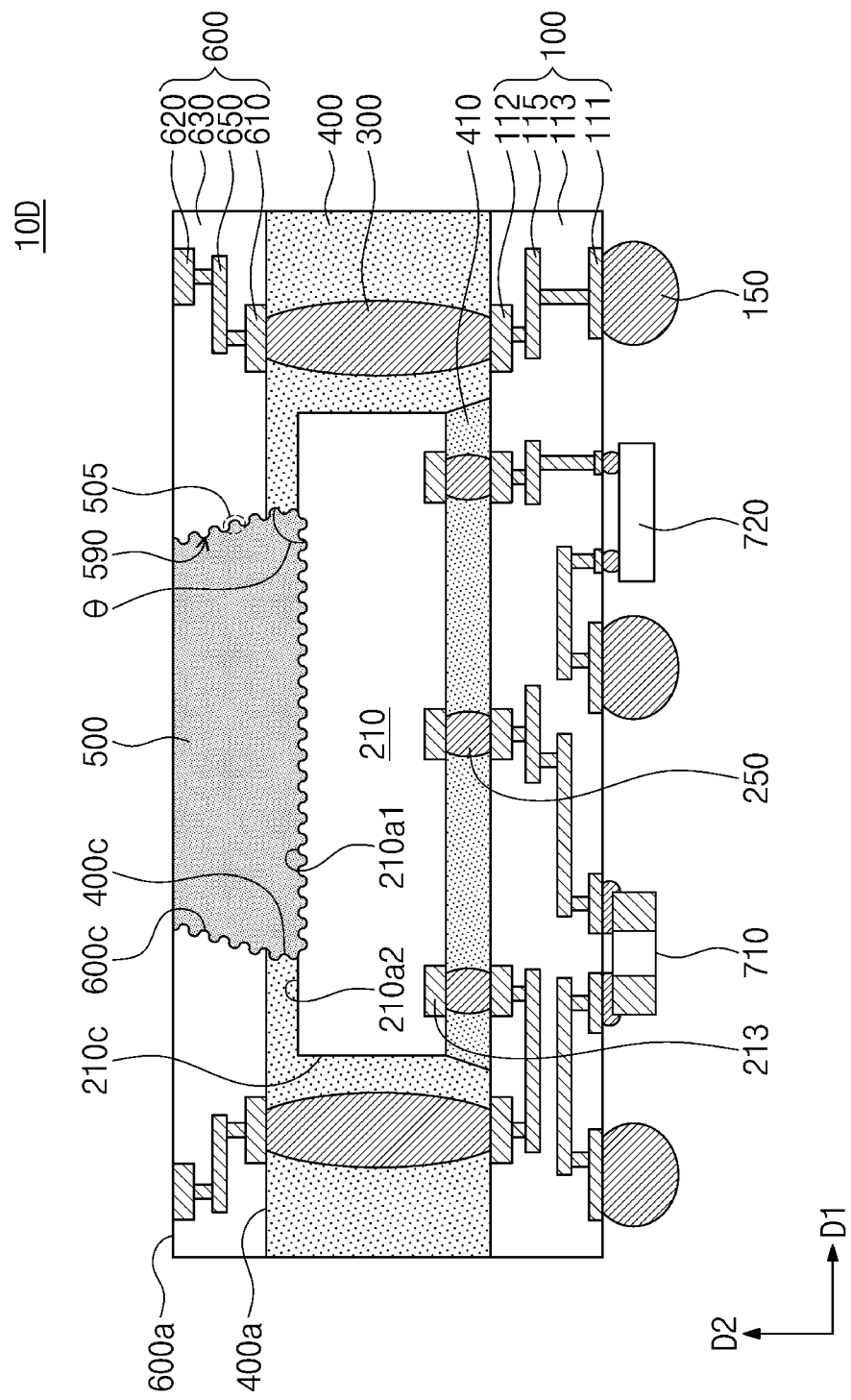
FIG. 3D is a diagram illustrating a semiconductor package according to an embodiment of the inventive concept.

FIG. 3D is a diagram illustrating a semiconductor package according to an embodiment of the inventive concept Referring to FIG. 3D, the semiconductor package 10D may include the first substrate 100, the solder balls 150, the first semiconductor chip 210, the mold layer 400, the conductive structures 300, the second substrate 600, and the heat dissipation structure 500. The side surface of the heat dissipation structure 500 may be inclined at an angle with respect to the bottom surface thereof. The angle θ between the bottom and side surfaces of the heat dissipation structure 500 may be an acute angle. For example, the angle θ between the bottom and side surfaces of the heat dissipation structure 500 may be smaller than 85°.

Figure 3E:
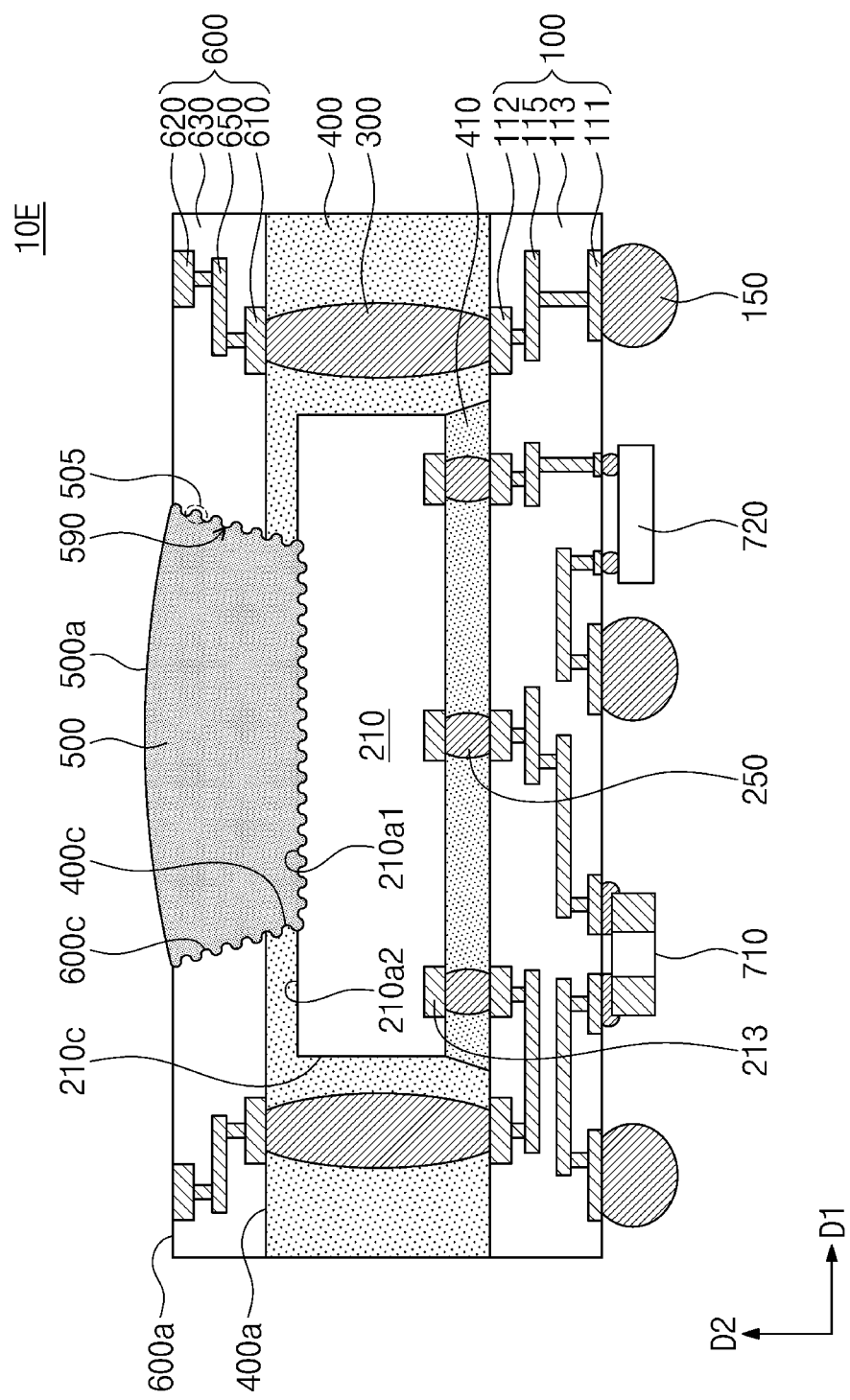
FIG. 3E is a diagram illustrating a semiconductor package according to an embodiment of the inventive concept.

FIG. 3E is a diagram illustrating a semiconductor package according to an embodiment of the inventive concept.

Referring to FIG. 3E, the semiconductor package 10E may include the first substrate 100, the solder balls 150, the first semiconductor chip 210, the mold layer 400, the conductive structures 300, the second substrate 600, and the heat dissipation structure 500. The top surface 500a of the heat dissipation structure 500 may have a dome shape. The top surface 500a of the heat dissipation structure 500 may be upwardly convex. For example, a center region of the top surface 500a of the heat dissipation structure 500 may be disposed at a level that is higher than an edge region of the top surface 500a of the heat dissipation structure 500. The center region of the top surface 500a of the heat dissipation structure 500 may be disposed at a level that is higher than the top surface 600a of the second substrate 600. In a plan view, the edge region of the heat dissipation structure 500 may be disposed between the center region of the heat dissipation structure 500 and the second substrate 600.

Figure 3F:
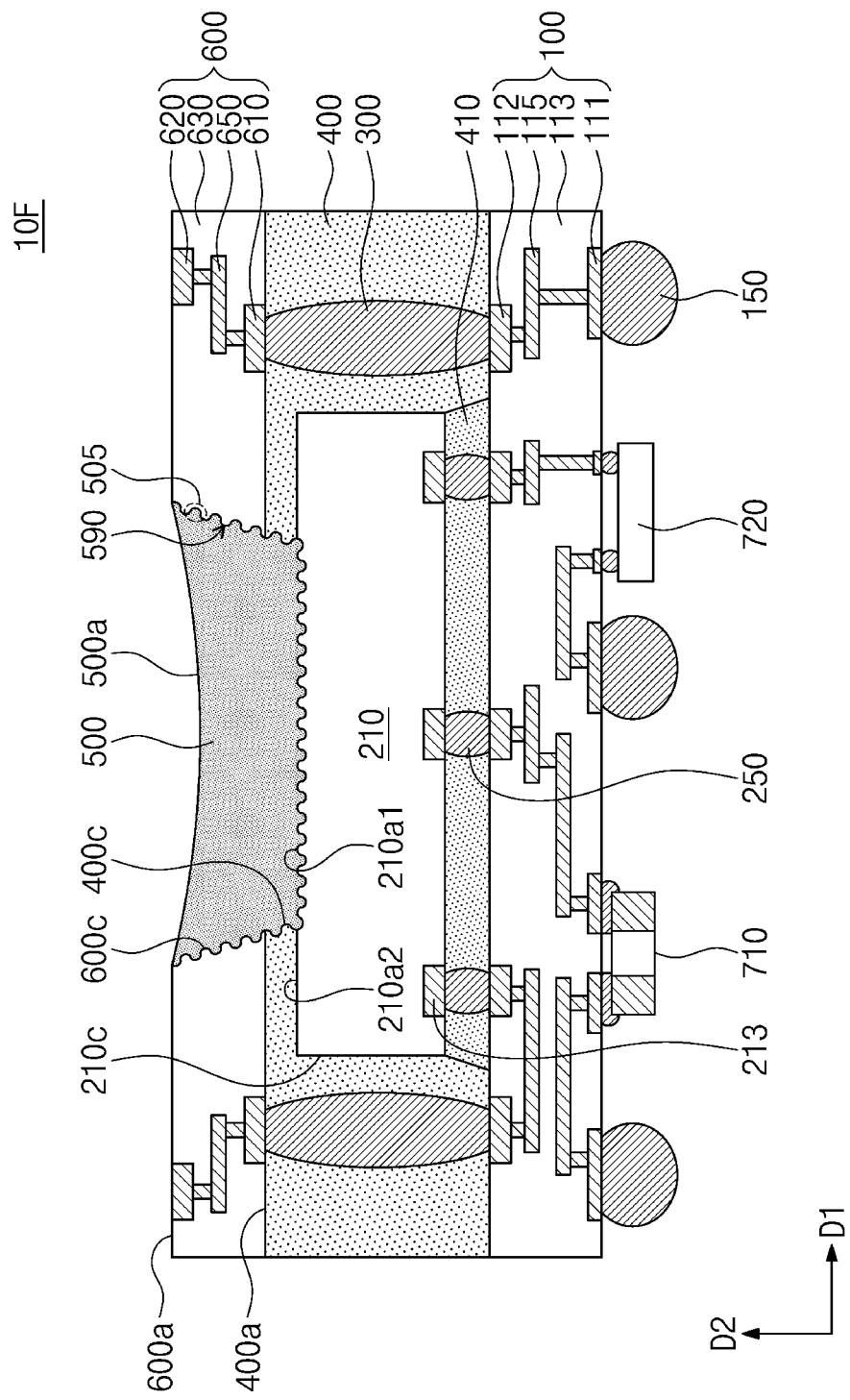
FIG. 3F is a diagram illustrating a semiconductor package according to an embodiment of the inventive concept.

FIG. 3F is a diagram illustrating a semiconductor package according to an embodiment of the inventive concept.

Referring to FIG. 3F, the semiconductor package 10F may include the first substrate 100, the solder balls 150, the first semiconductor chip 210, the mold layer 400, the conductive structures 300, the second substrate 600, and the heat dissipation structure 500. In an embodiment, the top surface 500a of the heat dissipation structure 500 may be concave. The center region of the top surface 500a of the heat dissipation structure 500 may be disposed at a level that is lower than the edge region of the top surface 500a of the heat dissipation structure 500. The center region of the top surface 500a of the heat dissipation structure 500 may be disposed at a level that is lower than the top surface 600a of the second substrate 600.

Figure 3G:
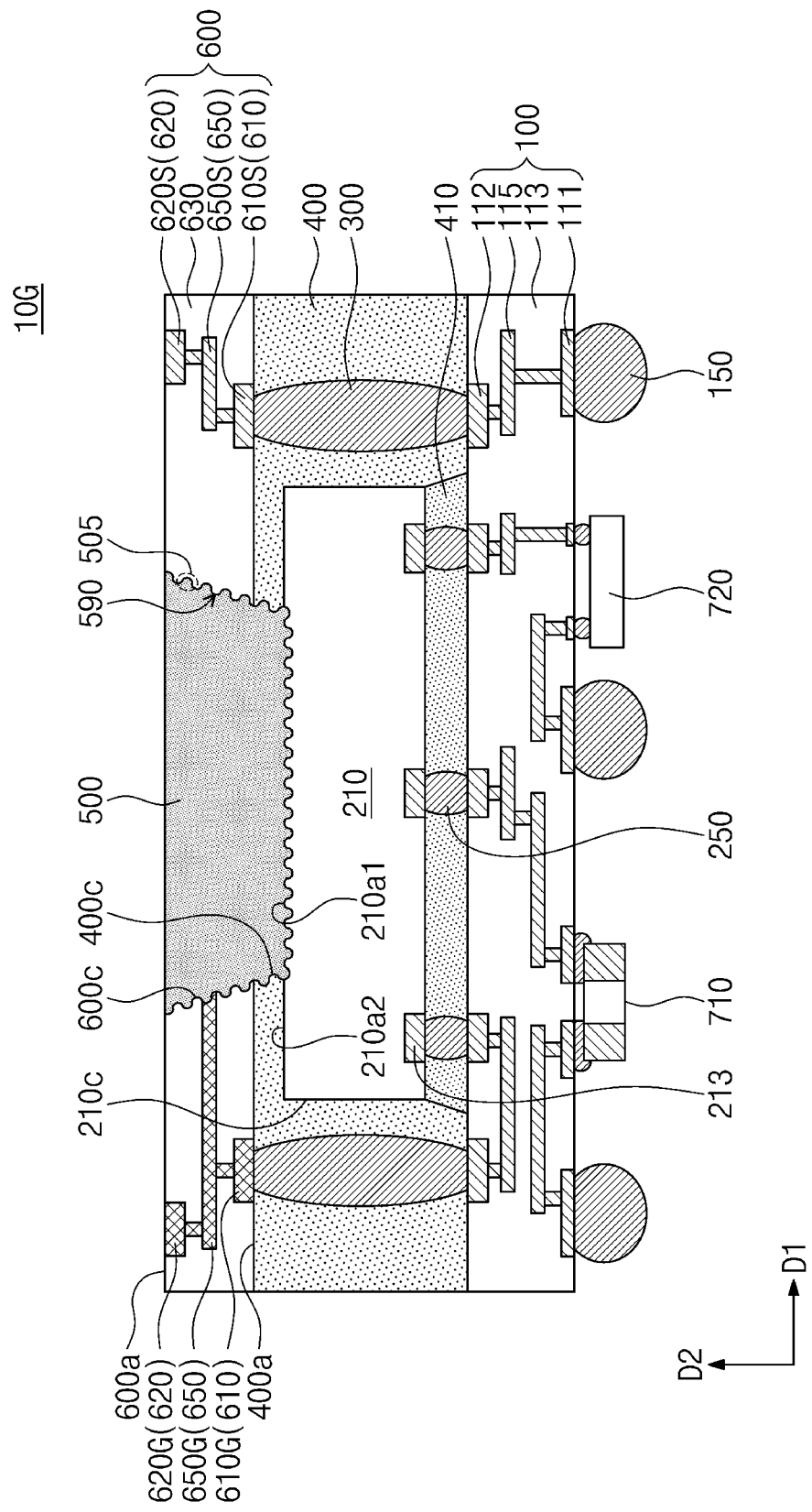
FIG. 3G is a diagram illustrating a semiconductor package according to an embodiment of the inventive concept.

FIG. 3G is a diagram illustrating a semiconductor package according to an embodiment of the inventive concept.

Referring to FIG. 3G, the semiconductor package 10G may include the first substrate 100, the solder balls 150, the first semiconductor chip 210, the mold layer 400, the conductive structures 300, the second substrate 600, and the heat dissipation structure 500.

The second substrate 600 may include the second insulating layer 630, the second lower pads 610, the second conductive patterns 650, and the second upper pads 620. The second lower pads 610 may include a lower signal pad 610S and a lower ground pad 610G. The lower ground pad 610G may be spaced apart from the lower signal pad 610S and may be electrically separated from the lower signal pad 610S. The second conductive patterns 650 may include a signal conductive pattern 650S and a ground conductive pattern 650G. The ground conductive pattern 650G may be spaced apart from the signal conductive pattern 650S and may be electrically separated from the signal conductive pattern 650S. The second upper pads 620 may include an upper signal pad 620S and an upper ground pad 620G. The upper ground pad 620G may be spaced apart from the upper signal pad 620S and may be electrically separated from the upper signal pad 620S.

The upper signal pad 620S may be electrically connected to the lower signal pad 610S through the signal conductive pattern 650S. The signal conductive pattern 650S might not be exposed or extended to the opening 590. The signal conductive pattern 650S may be spaced apart from and electrically separated from the heat dissipation structure 500.

The upper ground pad 620G may be electrically connected to the lower ground pad 610G through the ground conductive pattern 650G. At least a portion of the ground conductive pattern 650G may be exposed or extended to the opening 590. For example, the ground conductive pattern 650G may have a side surface that is exposed to the outside of the second substrate 600 near the inner side surface 600c. The heat dissipation structure 500 may cover at least a portion of the ground conductive pattern 650G. The heat dissipation structure 500 may be electrically connected to the ground conductive pattern 650G. Accordingly, it may be possible to apply a ground voltage to the heat dissipation structure 500 during an operation of the semiconductor package 10G. Accordingly, the heat dissipation structure 500 may serve as a shielding layer. For example, the heat dissipation structure 500 may be used to prevent an electromagnetic interference (EMI) issue associated with the first semiconductor chip 210. The electromagnetic interference issue may mean a failure in receiving/transmitting function of an electric element caused by an electromagnetic wave emitted from or passing through another electric element. Accordingly, it may be possible to increase reliability in a process of operating the semiconductor package 10G.

Figure 3H:
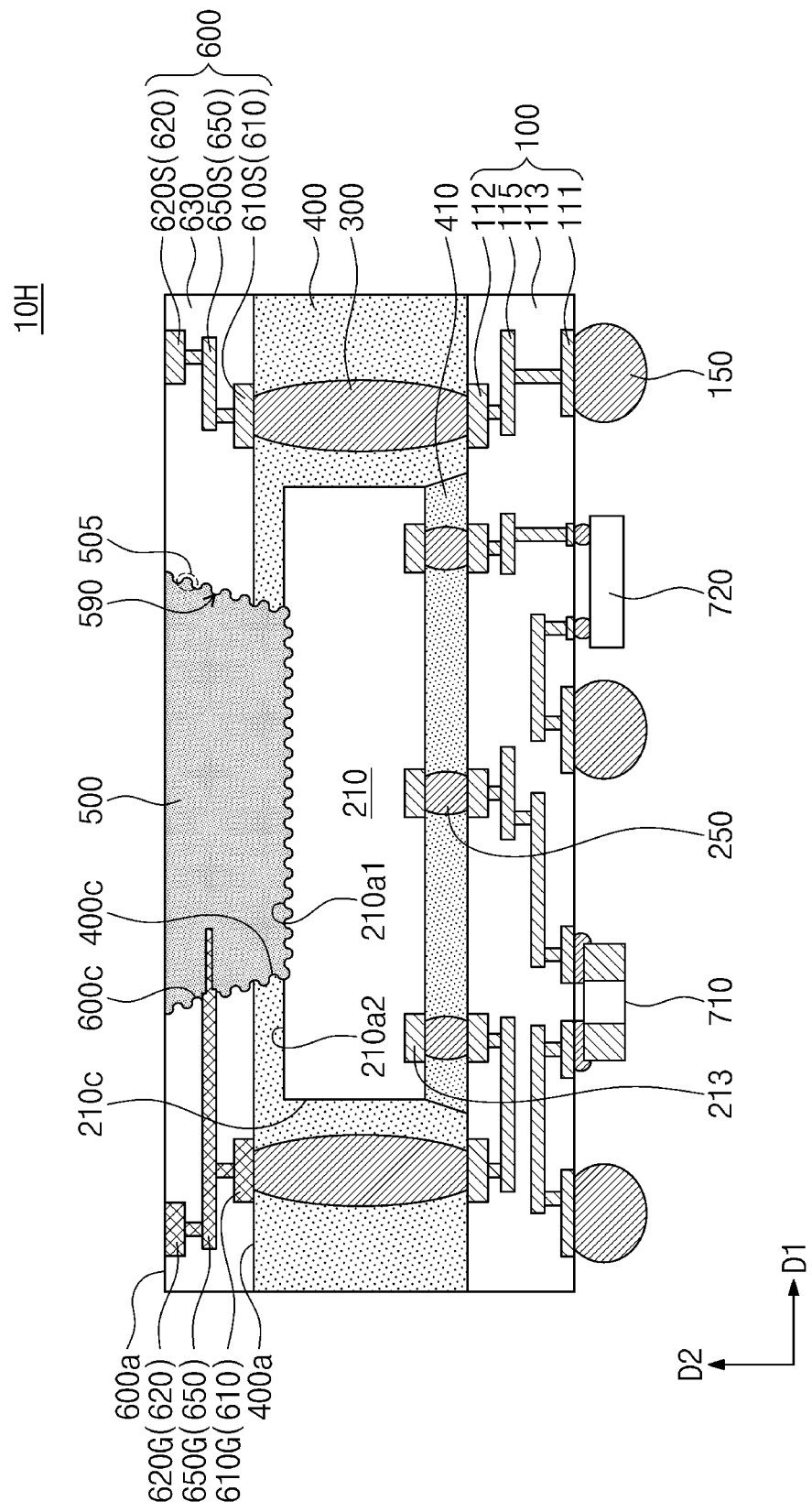
FIG. 3H is a diagram illustrating a semiconductor package according to an embodiment of the inventive concept.

FIG. 3H is a diagram illustrating a semiconductor package according to an embodiment of the inventive concept.

Referring to FIG. 3H, the semiconductor package 10H may include the first substrate 100, the solder balls 150, the first semiconductor chip 210, the mold layer 400, the conductive structures 300, the second substrate 600, and the heat dissipation structure 500. The heat dissipation structure 500 and the second substrate 600 may be substantially the same as those in the embodiment of FIG. 3G. For example, the heat dissipation structure 500 may be in contact with the ground conductive pattern 650G and may be electrically connected to the ground conductive pattern 650G. Here, the ground conductive pattern 650G may include a protruding portion that is extended into the heat dissipation structure 500. A thickness of the ground conductive pattern 650G in the heat dissipation structure 500 may be smaller than a thickness of the ground conductive pattern 650G in the second insulating layer 630. Unlike the illustrated structure, the thickness of the ground conductive pattern 650G in the heat dissipation structure 500 may be substantially equal to the thickness of the ground conductive pattern 650G in the second insulating layer 630.

Figure 3I:
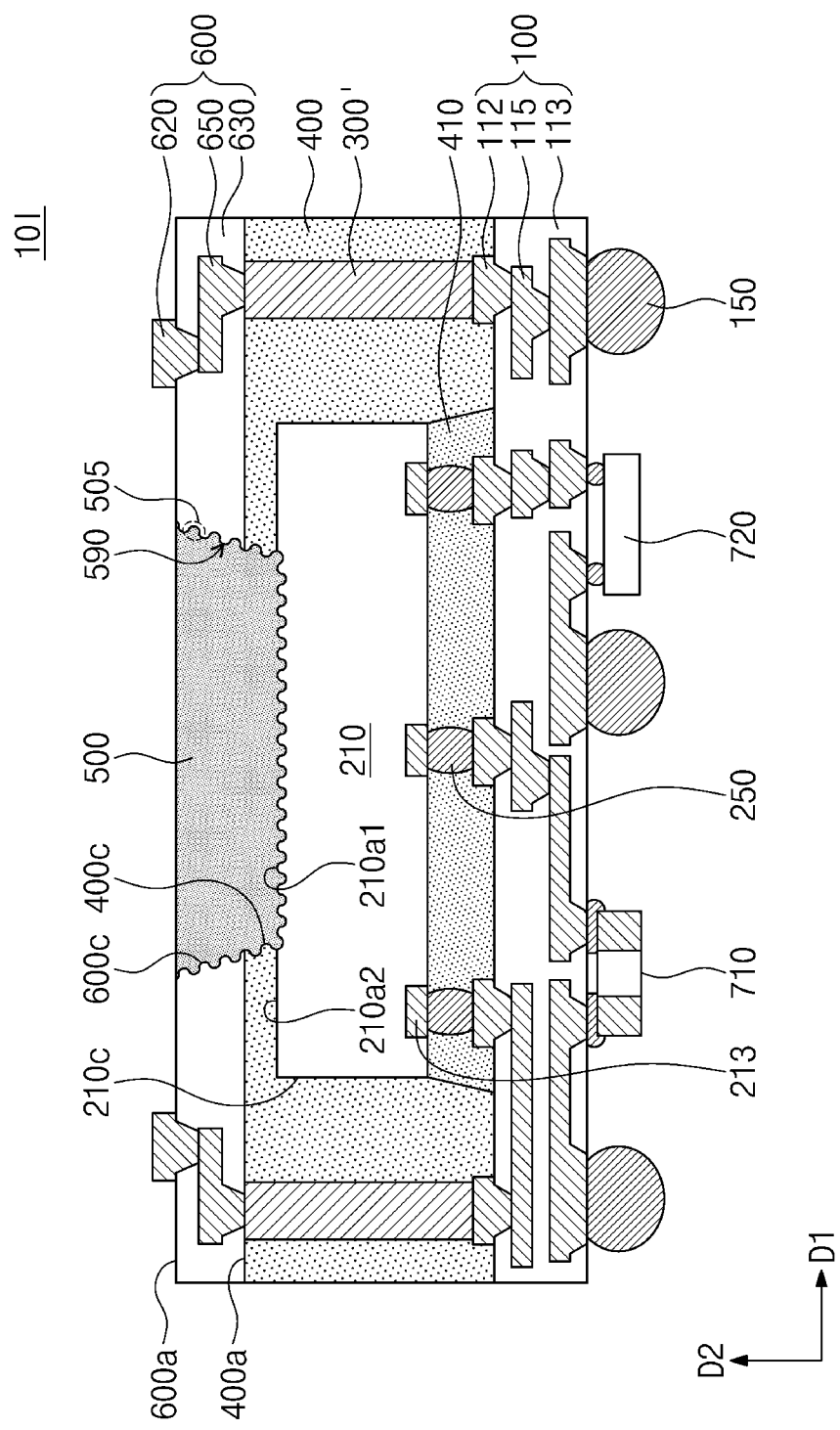
FIG. 3I is a diagram illustrating a semiconductor package according to an embodiment of the inventive concept.

FIG. 3I is a diagram illustrating a semiconductor package according to an embodiment of the inventive concept.

Referring to FIG. 3I, the semiconductor package 10I may include the first substrate 100, the solder balls 150, the first semiconductor chip 210, the mold layer 400, the conductive structures 300', the second substrate 600, and the heat dissipation structure 500. The first substrate 100 may have the same or similar features as that in the embodiment of FIG. 1A. For example, the first substrate 100 may include the first insulating layer 113, the first conductive patterns 115, and the first upper pads 112. The first substrate 100 may be a re-distribution layer or a redistribution substrate. The first conductive patterns 115 may be redistribution patterns. The first substrate 100 might not include the first lower pads 111 described with reference to FIG. 1A. In this case, the lowermost ones of the first conductive patterns 115 may serve as solder pads. For example, the solder balls 150 may be disposed on bottom surfaces of the lowermost ones of the first conductive patterns 115. The first insulating layer 113 may be formed of or may otherwise include a photosensitive polymer.

The conductive structures 300' may be disposed between the first substrate 100 and the second substrate 600. In an embodiment, the conductive structures 300' may include conductive posts or metal pillars. The conductive structures 300' may be formed of or may otherwise include a metallic material (e.g., copper). The conductive structures 300' may be formed of or may otherwise include a solder material.

The second substrate 600 may be disposed to have the same or similar features as that in the embodiment of FIG. 1A. For example, the second substrate 600 may include the second insulating layer 630, the second conductive patterns 650, and the second upper pads 620. The second substrate 600 may be a re-distribution layer or a redistribution substrate. The second conductive patterns 650 may be redistribution patterns. The second substrate 600 might not include the second lower pads 610 described with reference to FIG. 1A. In this case, the lowermost ones of the second conductive patterns 650 may be in contact with the conductive structures 300'. The second insulating layer 630 may include a photosensitive polymer.

Figure 3J:
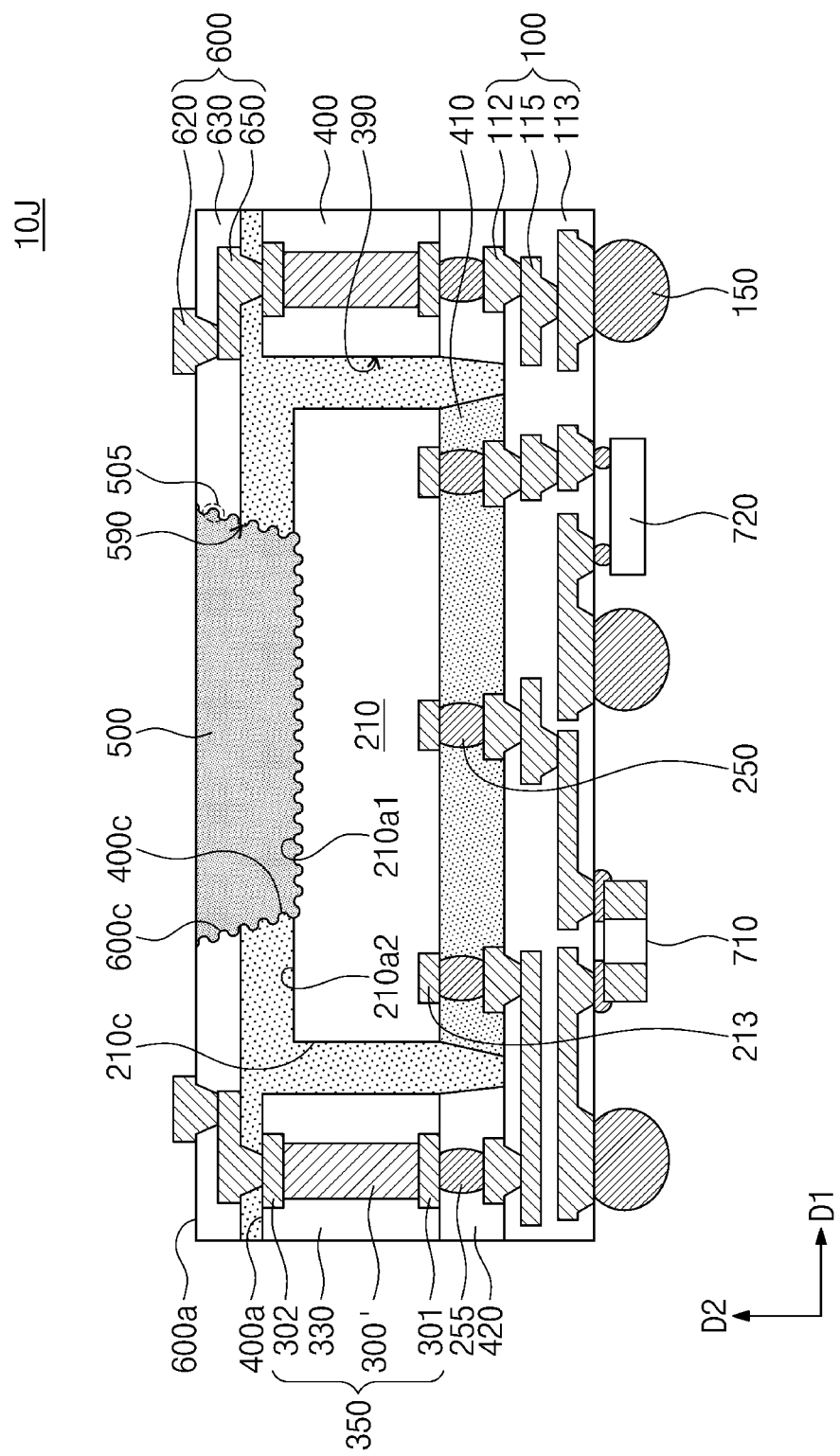
FIG. 3J is a diagram illustrating a semiconductor package according to an embodiment of the inventive concept.

FIG. 3J is a diagram illustrating a semiconductor package according to an embodiment of the inventive concept. For the sake of brevity, one of the conductive structures will be described in the following description of FIG. 3J and it may be understood that the other conductive structures are at least similarly arranged.

Referring to FIG. 3J, the semiconductor package 10J may include the first substrate 100, the solder balls 150, the first semiconductor chip 210, a connection substrate 350, the mold layer 400, the second substrate 600, and the heat dissipation structure 500. The first substrate 100 and the second substrate 600 may be substantially the same as those in the embodiment of FIG. 3I.

The connection substrate 350 may be disposed on the first substrate 100. The connection substrate 350 may have a substrate hole 390, which vertically penetrates the same. As an example, the connection substrate 350 may be fabricated by forming the substrate hole 390 to penetrate a printed circuit board vertically (i.e., from top to bottom). The first semiconductor chip 210 may be disposed in the substrate hole 390 of the connection substrate 350. The first semiconductor chip 210 may be spaced apart from an inner side surface of the connection substrate 350.

The connection substrate 350 may include a base layer 330 and the conductive structure 300'. The substrate hole 390 may penetrate the base layer 330. Unlike the illustrated structure, the base layer 330 may include a plurality of stacked layers. The base layer 330 may include an insulating material. For example, the base layer 330 may be formed of or may otherwise include carbon-based materials, ceramic materials, and/or polymers. The conductive structure 300' may be disposed in the base layer 330. The connection substrate 350 may further include a first connection pad 301 and a second connection pad 302. The first connection pad 301 may be disposed on a bottom surface of the conductive structure 300'. The second connection pad 302 may be disposed on a top surface of the conductive structure 300'. The second connection pad 302 may be electrically connected to the first connection pad 301 through the conductive structure 300'. The conductive structure 300', the first connection pad 301, and the second connection pad 302 may be formed of or may otherwise include, for example, copper, aluminum, tungsten, titanium, tantalum, iron, and/or alloys thereof.

A connection bump 255 may be disposed between the first substrate 100 and the connection substrate 350. The connection bump 255 may be interposed between and coupled to the first connection pad 301 and a corresponding one of the first upper pads 112. The conductive structure 300' may be electrically connected to the first substrate 100 by the connection bump 255. The connection bump 255 may include solder balls, solder bumps, and/or solder pillars. The connection bump 255 may be formed of or may otherwise include a metallic material.

A second under-fill layer 420 may be disposed in a gap between the first substrate 100 and the connection substrate 350 to hermetically seal the connection bump 255. The second under-fill layer 420 may be formed of or may otherwise include an insulating polymer.

The mold layer 400 may be disposed on the first semiconductor chip 210 and the connection substrate 350. The mold layer 400 may be interposed between the first semiconductor chip 210 and the connection substrate 350. In an embodiment, the mold layer 400 may be an insulating adhesive film, which is attached to a top surface of the connection substrate 350, the second top surface 210a2 of the first semiconductor chip 210, and the side surface 210c of the first semiconductor chip 210. For example, an Ajinomoto build-up film (ABF) may be used as the adhesive insulating film. As an example, the mold layer 400 may be formed of or may otherwise include an insulating polymer (e.g., epoxy-based polymer). The mold layer 400 may be formed of or may otherwise include a material different from the second under-fill layer 420. As other example, the second under-fill layer 420 may be omitted, and the mold layer 400 may be further extended into a gap between the first substrate 100 and the connection substrate 350.

Figure 3K:
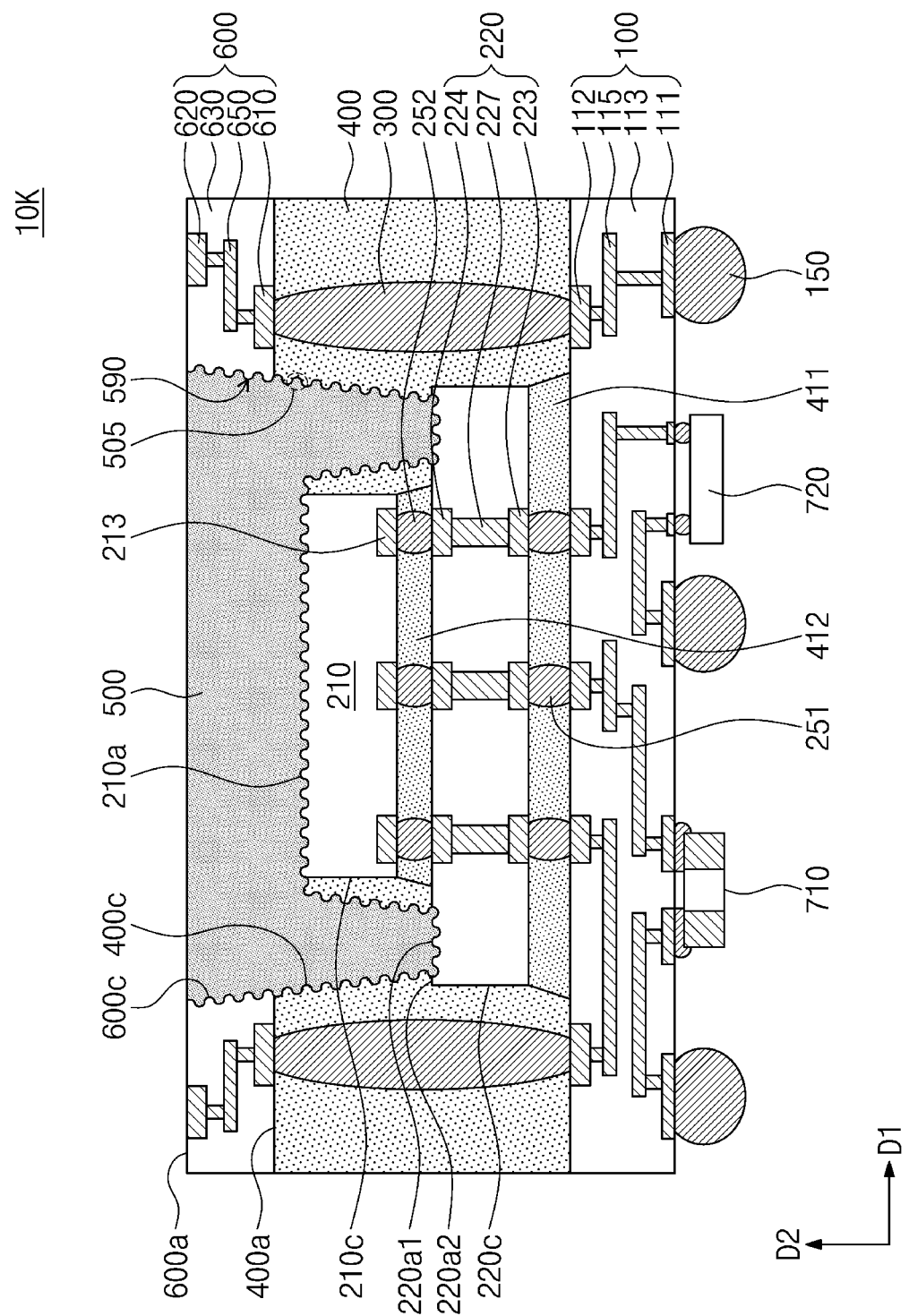
FIG. 3K is a diagram illustrating a semiconductor package according to an embodiment of the inventive concept.

FIG. 3K is a diagram illustrating a semiconductor package according to an embodiment of the inventive concept.

Referring to FIG. 3K, the semiconductor package 10K may include the first substrate 100, the solder balls 150, the first semiconductor chip 210, a second semiconductor chip 220, the mold layer 400, the conductive structure 300, the second substrate 600, and the heat dissipation structure 500.

The second semiconductor chip 220 may be interposed between the first substrate 100 and the first semiconductor chip 210. The second semiconductor chip 220 may include a first top surface 220a1 and a second top surface 220a2. The second semiconductor chip 220 may include lower conductive pads 223, penetration vias 227, and upper conductive pads 224. The lower conductive pads 223 and the upper conductive pads 224 may be respectively disposed on bottom and top surfaces of the second semiconductor chip 220. The penetration vias 227 may be disposed in the second semiconductor chip 220. For example, the penetration vias 227 may penetrate the second semiconductor chip 220. The upper conductive pads 224 may be electrically connected to the lower conductive pads 223 through the penetration vias 227.

First conductive bumps 251 may be interposed between the first substrate 100 and the first semiconductor chip 210 and may be electrically connected to the first upper pads 112 and the lower conductive pads 223. A first under-fill pattern 411 may be disposed in a gap region between the first substrate 100 and the first semiconductor chip 210 to hermetically seal the first conductive bumps 251. The first conductive bumps 251 and the first under-fill pattern 411 may be formed of or may otherwise include the same materials as the conductive bumps 250 and the first under-fill layer 410, respectively, described with reference to FIG. 1A.

Second conductive bumps 252 may be interposed between the first semiconductor chip 210 and the second semiconductor chip 220 and may be electrically connected to the upper conductive pads 224 and the first chip pads 213. A second under-fill pattern 412 may be disposed in a gap region between the first semiconductor chip 210 and the second semiconductor chip 220 to hermetically seal the second conductive bumps 252. The second conductive bumps 252 and the second under-fill pattern 412 may be formed of or may otherwise include the same materials as the conductive bumps 250 and the first under-fill layer 410, respectively, described with reference to FIG. 1A.

The heat dissipation structure 500 may be disposed on the first top surface 210a1 of the first semiconductor chip 210 and in the opening 590. The heat dissipation structure 500 may at least partially cover the inner side surface 600c of the second substrate 600 and the inner side surface 400c of the mold layer 400. The heat dissipation structure 500 may further penetrate the mold layer 400 and may at least partially cover the first top surface 220a1 of the second semiconductor chip 220. The heat dissipation structure 500 may be spaced apart from the second top surface 220a2 of the second semiconductor chip 220. The first top surface 220a1 of the second semiconductor chip 220 may have a surface roughness that is greater than a side surface 220c of the second semiconductor chip 220. The first top surface 220a1 of the second semiconductor chip 220 may have a surface roughness that is greater than the second top surface 220a2 of the second semiconductor chip 220. As an example, the first top surface 220a1 of the second semiconductor chip 220 may have a surface roughness that is equal to or smaller than the second top surface 220a2 of the second semiconductor chip 220. The heat dissipation structure 500 may include the first protruding portions 505, and the first protruding portions 505 may be further disposed on the first top surface 220a1 of the second semiconductor chip 220.

The heat dissipation structure 500 may be interposed between the side surface 210c of the first semiconductor chip 210 and the conductive structure 300. The heat dissipation structure 500 may be laterally spaced apart from the conductive structure 300.

Figure 4:
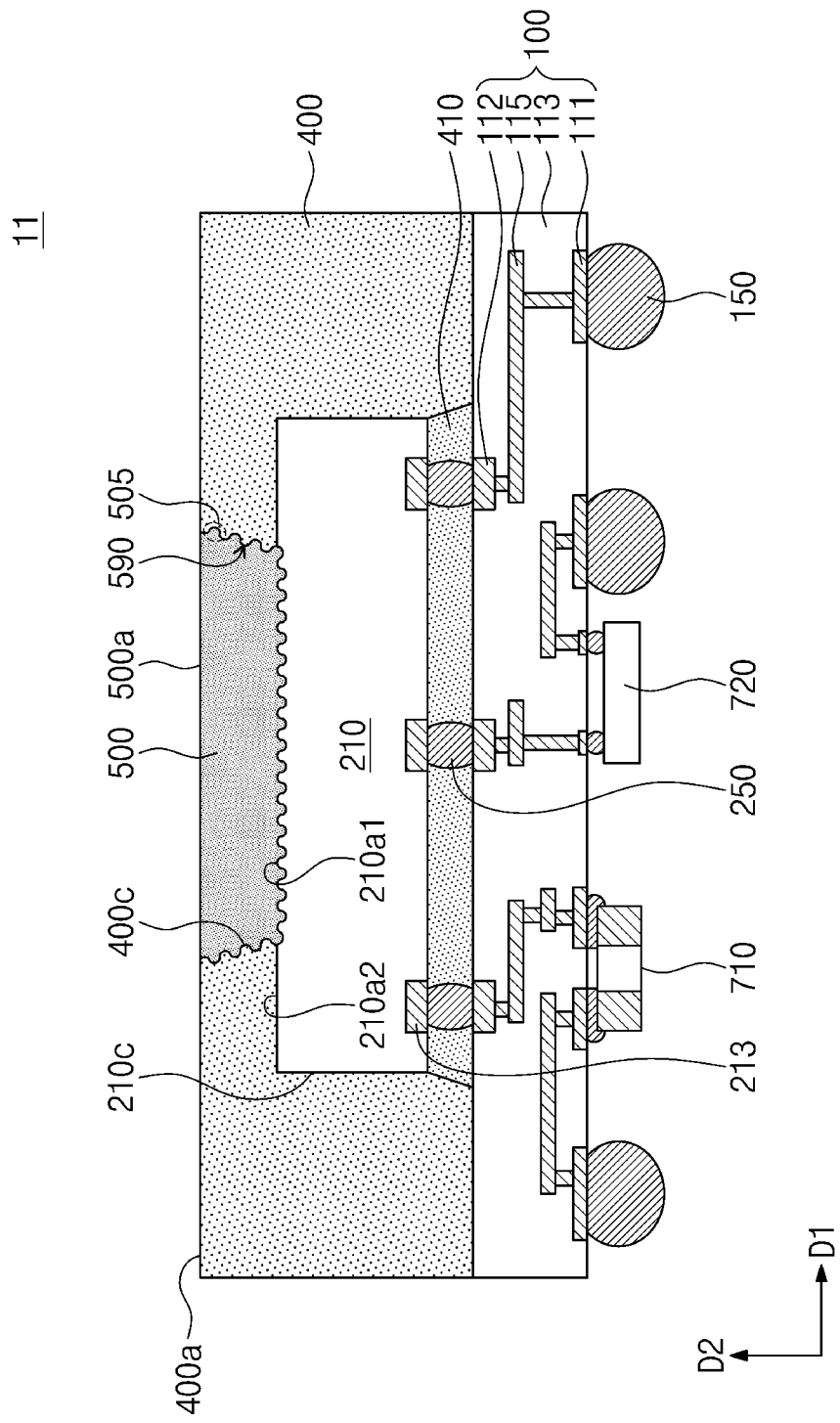
FIG. 4 is a diagram illustrating a semiconductor package according to an embodiment of the inventive concept.

FIG. 4 is a diagram illustrating a semiconductor package according to an embodiment of the inventive concept.

Referring to FIG. 4, a semiconductor package 11 may include the first substrate 100, the solder balls 150, the first semiconductor chip 210, the second semiconductor chip 220, the mold layer 400, and the heat dissipation structure 500. The semiconductor package 11 might not include the second substrate 600 and the conductive structure 300 described in the embodiment of FIG. 1A. The top surface 500a of the heat dissipation structure 500 may be disposed at a level that is equal to or different from the top surface 400a of the mold layer 400.

The afore-described embodiments may be combined to each other to realize the inventive concept. For example, at least two of the embodiments for the semiconductor package 10 of FIG. 1A, the semiconductor package 10A of FIG. 3A, the semiconductor package 10B of FIG. 3B, the semiconductor package 10C of FIG. 3C, the semiconductor package 10D of FIG. 3D, the semiconductor package 10E of FIG. 3E, the semiconductor package 10F of FIG. 3F, the semiconductor package 10G of FIG. 3G, the semiconductor package 10H of FIG. 3H, the semiconductor package 10I of FIG. 3I, the semiconductor package 10J of FIG. 3J, the semiconductor package 10K of FIG. 3K, and the semiconductor package 11 of FIG. 4 may be combined to each other. As an example, the semiconductor package 10 of FIG. 1A, the semiconductor package 10A of FIG. 3A, the semiconductor package 10B of FIG. 3B, the semiconductor package 10C of FIG. 3C, the semiconductor package 10D of FIG. 3D, the semiconductor package 10E of FIG. 3E, the semiconductor package 10F of FIG. 3F, the semiconductor package 10G of FIG. 3G, the semiconductor package 10H of FIG. 3H, the semiconductor package 10I of FIG. 3I, the semiconductor package 10J of FIG. 3J, or the semiconductor package 10K of FIG. 3K might not include the second substrate 600 and the conductive structure 300, as in the semiconductor package 11 in the embodiment of FIG. 4.

Figure 5A:
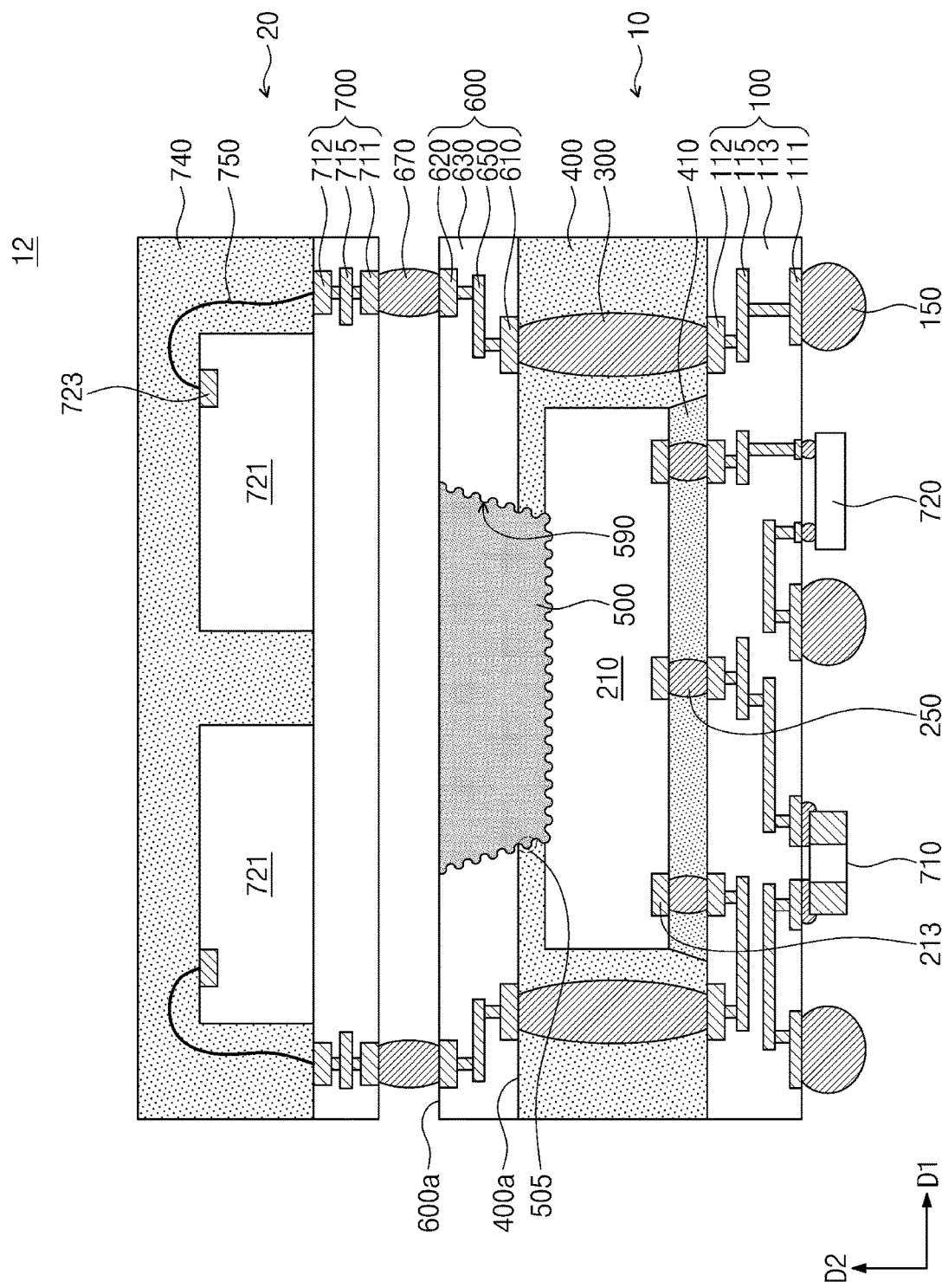
FIG. 5A is a diagram illustrating a semiconductor package according to an embodiment of the inventive concept.

FIG. 5A is a diagram illustrating a semiconductor package according to an embodiment of the inventive concept.

Referring to FIG. 5A, a semiconductor package 12 may include a lower semiconductor package 10' and an upper semiconductor package 20. The lower semiconductor package 10' may be substantially the same as the semiconductor package 10 described in the embodiment of FIG. 1A. For example, the lower semiconductor package 10' may include the first substrate 100, the solder balls 150, the first semiconductor chip 210, the conductive structure 300, the mold layer 400, the second substrate 600, and the heat dissipation structure 500. The lower semiconductor package 10' may further include the first and second passive devices 710 and 720, the conductive bumps 250, and the first under-fill layer 410. As an example, the lower semiconductor package 10' may be substantially the same as the semiconductor package 10A of FIG. 3A, the semiconductor package 10B of FIG. 3B, the semiconductor package 10C of FIG. 3C, the semiconductor package 10D of FIG. 3D, the semiconductor package 10E of FIG. 3E, the semiconductor package 10F of FIG. 3F, the semiconductor package 10G of FIG. 3G, the semiconductor package 10H of FIG. 3H, the semiconductor package 10I of FIG. 3I, the semiconductor package 10J of FIG. 3J, or the semiconductor package 10K of FIG. 3K.

The upper semiconductor package 20 may be disposed on the lower semiconductor package 10'. The upper semiconductor package 20 may include an upper substrate 700, an upper semiconductor chip 721, and an upper mold layer 740. The upper substrate 700 may be disposed on the top surface 600a of the second substrate 600 and may be spaced apart from the top surface 600a of the second substrate 600. The upper substrate 700 may be a printed circuit board (PCB) or a re-distribution layer. The upper substrate 700 may include first substrate pads 711, second substrate pads 712, and metal lines 715. The first and second substrate pads 711 and 712 may be respectively disposed on bottom and top surfaces of the upper substrate 700. The metal lines 715 may be disposed in the upper substrate 700 and may be coupled to the first and second substrate pads 711 and 712.

The upper semiconductor chip 721 may be mounted on the top surface of the upper substrate 700. The upper semiconductor chip 721 may include upper chip pads 723 and second integrated circuits. The second integrated circuits may be disposed in the upper semiconductor chip 721. The upper chip pads 723 may be disposed on the top surface of the upper semiconductor chip 721 and may be coupled to the second integrated circuits. The upper chip pads 723 may be formed of or may otherwise include, for example, a metallic material. The upper semiconductor chip 721 may be a semiconductor chip that is of a different kind from the first semiconductor chip 210. For example, the first semiconductor chip 210 may be a logic chip, and the upper semiconductor chip 721 may be a memory chip.

The upper semiconductor package 20 may further include bonding wires 750. The bonding wires 750 may be disposed on the top surface of the upper semiconductor chip 721 and may be coupled to the second substrate pads 712 and the upper chip pads 723. The bonding wires 750 may be formed of or may otherwise include, for example, a metallic material.

The upper semiconductor package 20 may include a plurality of upper semiconductor chips 721. The upper semiconductor chips 721 may be laterally spaced apart from each other.

The upper mold layer 740 may be disposed on the upper substrate 700 and may at least partially cover top and side surfaces of the upper semiconductor chips 721. In an embodiment, the upper mold layer 740 may also at least partially cover the bonding wires 750. The upper mold layer 740 may be formed of or may otherwise include an insulating polymer (e.g., epoxy-based molding compound).

The upper semiconductor package 20 may further include connection solder balls 670. The connection solder balls 670 may be disposed between the second substrate 600 and the upper substrate 700. For example, the connection solder balls 670 may be disposed between the second upper pads 620 and the first substrate pads 711 and may be coupled to the second upper pads 620 and the first substrate pads 711. Thus, the upper semiconductor chip 721 may be electrically connected to the first semiconductor chip 210 or the solder balls 150 through the connection solder balls 670.

Figure 5B:
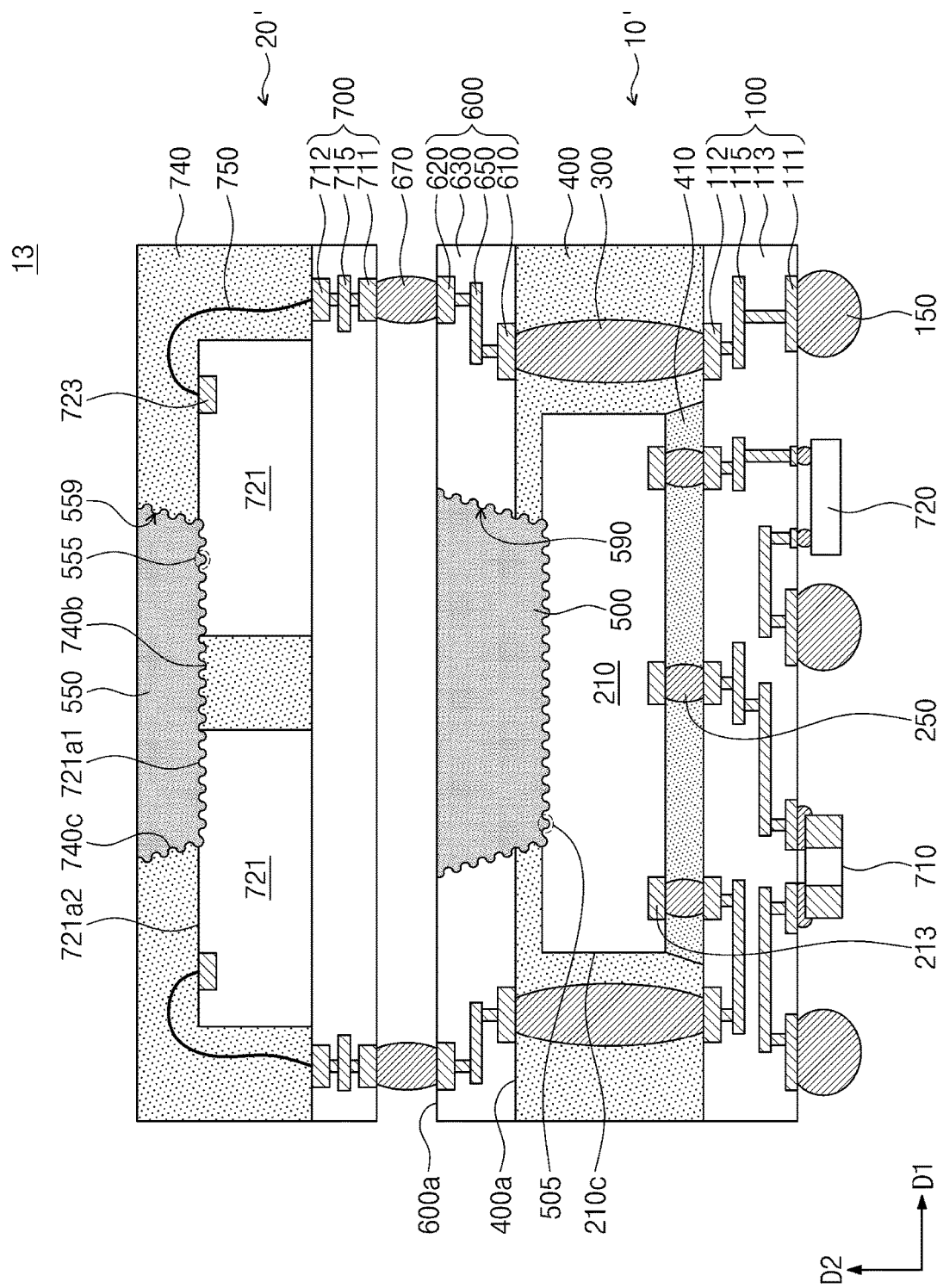
FIG. 5B is a diagram illustrating a semiconductor package according to an embodiment of the inventive concept.

FIG. 5B is a diagram illustrating a semiconductor package according to an embodiment of the inventive concept.

Referring to FIG. 5B, a semiconductor package 13 may include the lower semiconductor package 10', an upper semiconductor package 20', and the connection solder balls 670. The lower semiconductor package 10', the upper semiconductor package 20', and the connection solder balls 670 may be substantially the same as those in the lower semiconductor package 10', the upper semiconductor package 20, and the connection solder balls 670 in the embodiment of FIG. 5A.

However, the upper semiconductor package 20' may further include an upper heat dissipation structure 550. The upper heat dissipation structure 550 may be disposed on a first top surfaces 721a1 of the upper semiconductor chips 721 and in the upper mold layer 740. The upper heat dissipation structure 550 may be disposed in an upper opening 559. The upper opening 559 may penetrate a top surface of the upper mold layer 740 and may expose the first top surfaces 721a1 of the upper semiconductor chips 721 and an inner bottom surface 740b of the upper mold layer 740. The inner bottom surface 740b of the upper mold layer 740 may be disposed at the same or similar level as the first top surfaces 721a1 of the upper semiconductor chips 721. The upper heat dissipation structure 550 might not cover second top surfaces 721a2 of the upper semiconductor chips 721. The upper mold layer 740 may at least partially cover the second top surfaces 721a2 of the upper semiconductor chips 721. The upper heat dissipation structure 550 may be similar to the heat dissipation structure 500 of FIG. 1A or the heat dissipation structure 500 of FIG. 4. For example, the upper heat dissipation structure 550 may include a plurality of second protruding portions 555, and the second protruding portions 555 may be disposed on the first top surfaces 721a1 of the upper semiconductor chips 721, inner side surfaces 740c of the upper mold layer 740, and the inner bottom surface 740b of the upper mold layer 740. A surface roughness of the first top surfaces 721a1 of the upper semiconductor chips 721 may be greater than a surface roughness of the side surfaces of the upper semiconductor chips 721. A surface roughness of the inner side surfaces 740c of the upper mold layer 740 and a surface roughness of the inner bottom surface 740b of the upper mold layer 740 may be greater than a surface roughness of the top surface of the upper mold layer 740. The upper mold layer 740 may at least partially cover the second top surfaces 721a2 of the upper semiconductor chips 721.

The upper heat dissipation structure 550 may further include voids disposed therein. The voids in the upper heat dissipation structure 550 may be substantially the same as the voids 570 of FIG. 1B, the voids 570 of FIG. 1C, the voids 570 of FIG. 1D, the voids 570 of FIG. 2D, or the voids 570 of FIG. 2E.

Since the upper semiconductor package 20' includes the upper heat dissipation structure 550, heat, which is generated by the upper semiconductor chips 721 during an operation of the upper semiconductor package 20', may be more quickly dissipated to the outside. Accordingly, it may be possible to increase thermal dissipation and operational characteristics of the upper semiconductor package 20'.

FIGS. 6A to 6D are diagrams illustrating a semiconductor package according to an embodiment of the inventive concept.

Figure 6A:
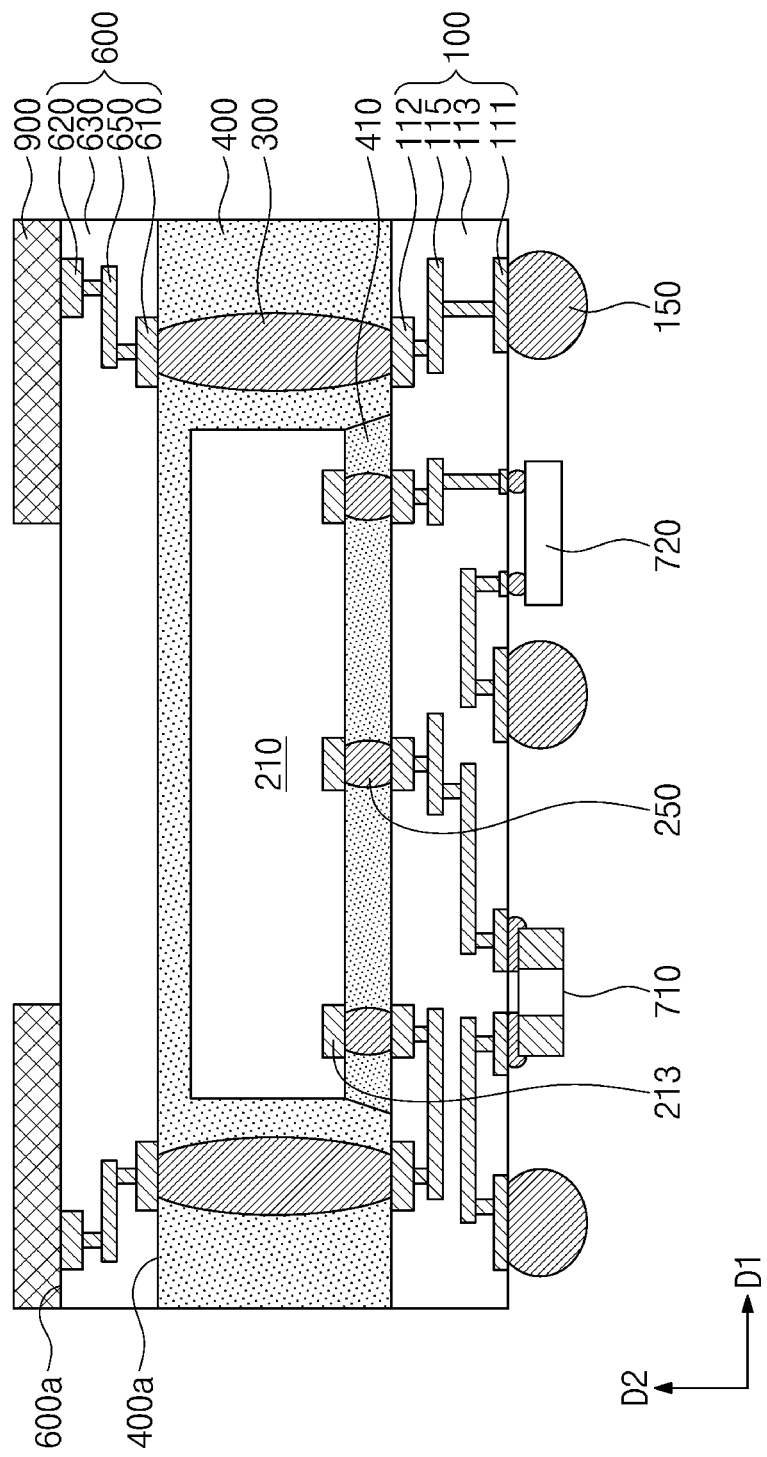
FIGS. 6A to 6D are diagrams illustrating a semiconductor package according to an embodiment of the inventive concept.

Referring to FIG. 6A, the first semiconductor chip 210, the conductive structure 300, the mold layer 400, and the second substrate 600 may be formed on the top surface of the first substrate 100. The conductive bumps 250 and the first under-fill layer 410 may be formed between the first substrate 100 and the first semiconductor chip 210. The second substrate 600 may be formed on the mold layer 400 and may at least partially cover the top surface 400a of the mold layer 400. A mask pattern 900 may be formed on the top surface 600a of the second substrate 600. The mask pattern 900 may be formed of or may otherwise include a metallic material (e.g., stainless steel). The mask pattern 900 may have a guide opening. The guide opening may expose the top surface 600a of the second substrate 600. The guide opening may be overlapped with the first semiconductor chip 210, in a plan view. The first and second passive devices 710 and 720 and the solder balls 150 may be formed on the bottom surface of the first substrate 100.

Figure 6B:
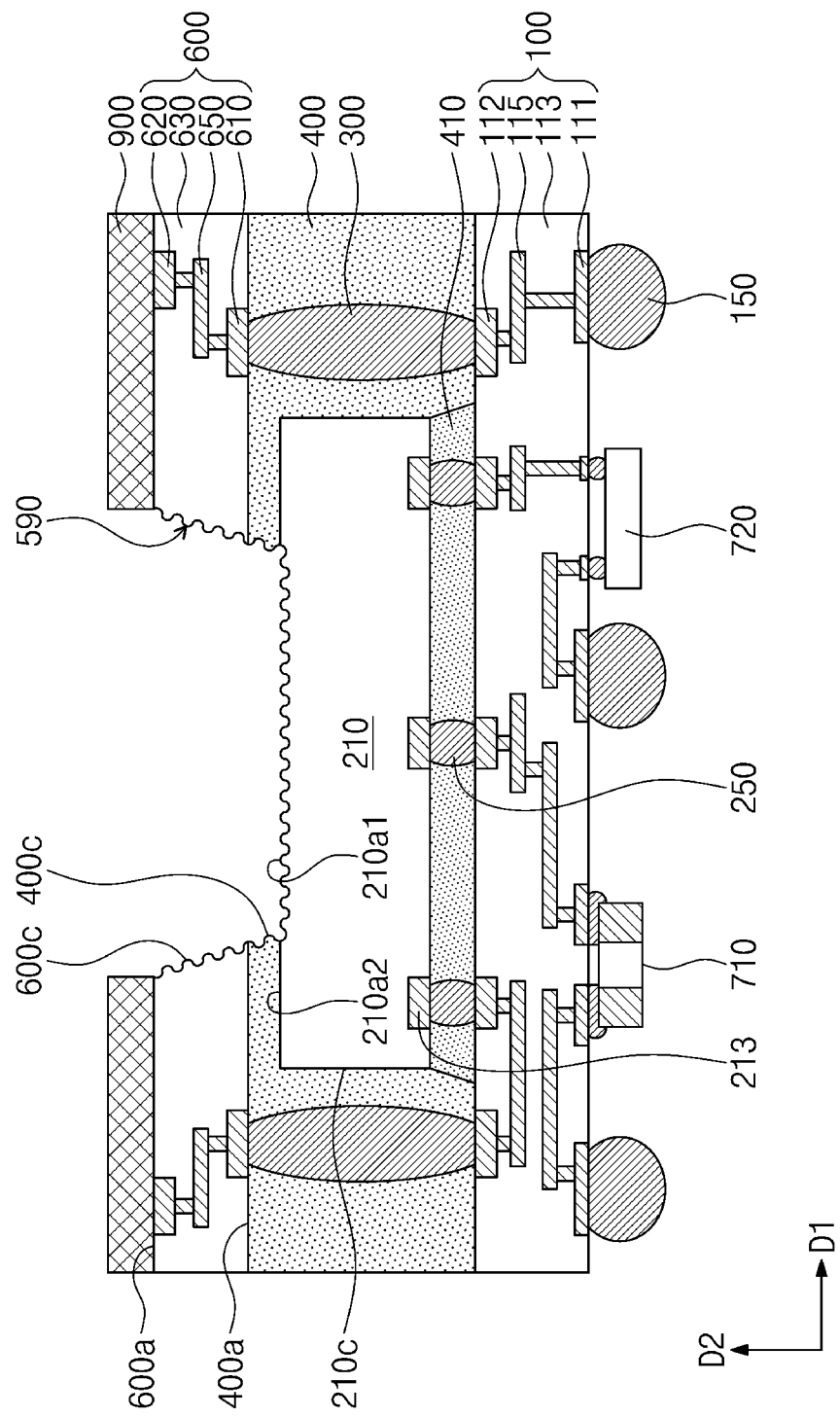

Referring to FIG. 6B, the opening 590 may be formed in the second substrate 600 and the mold layer 400 and may expose the semiconductor chip. The formation of the opening 590 may include removing the second substrate 600 and the mold layer 400, which are exposed by the mask pattern 900. The removal of the second substrate 600 and the mold layer 400 may be performed by a blast process. For example, the blast process may be a sand blast process. In an embodiment, polishing particles (e.g., silica, metal, glass, and/or glass) may be disposed on the second substrate 600 exposed through the opening 590. The polishing particles may collide with the second substrate 600 and the mold layer 400, and in this case, the second substrate 600 and the mold layer 400 may be partially removed by the collision of the polishing particles. Thus, the opening 590 may be formed. The opening 590 may expose the first top surface 210a1 of the first semiconductor chip 210, the inner side surface 600c of the second substrate 600, and the inner side surface 400c of the mold layer 400. After the blast process is finished, the surface roughness of the first top surface 210a1 of the first semiconductor chip 210 may be greater than the surface roughness of the side surface 210c of the first semiconductor chip 210. The surface roughness of the inner side surface 400c of the mold layer 400 may be greater than the surface roughness of the top surface 400a of the mold layer 400. The surface roughness of the inner side surface 600c of the second substrate 600 may be greater than the surface roughness of the top surface 600a of the second substrate 600.

Figure 6C:
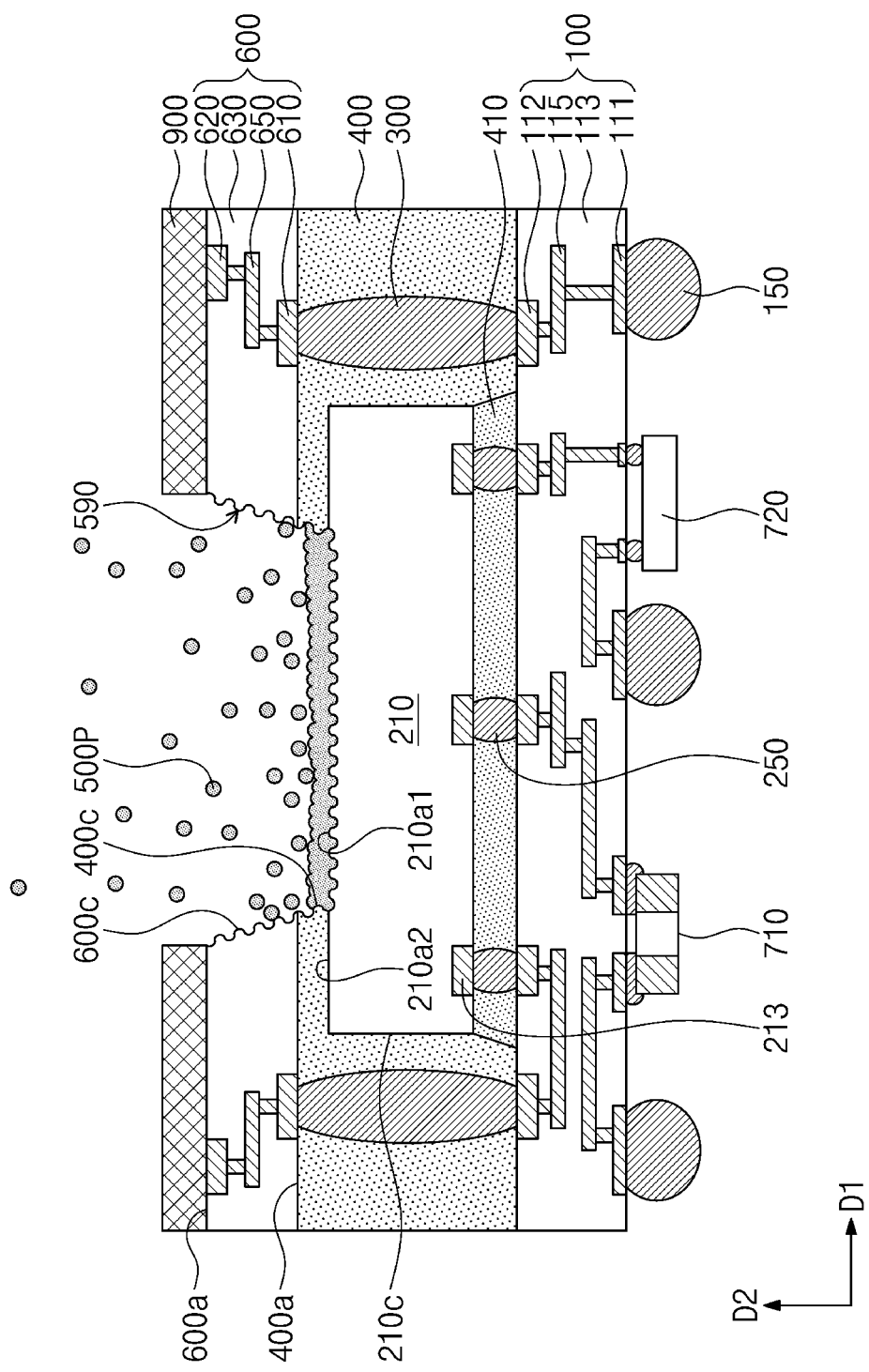
Figure 6D:
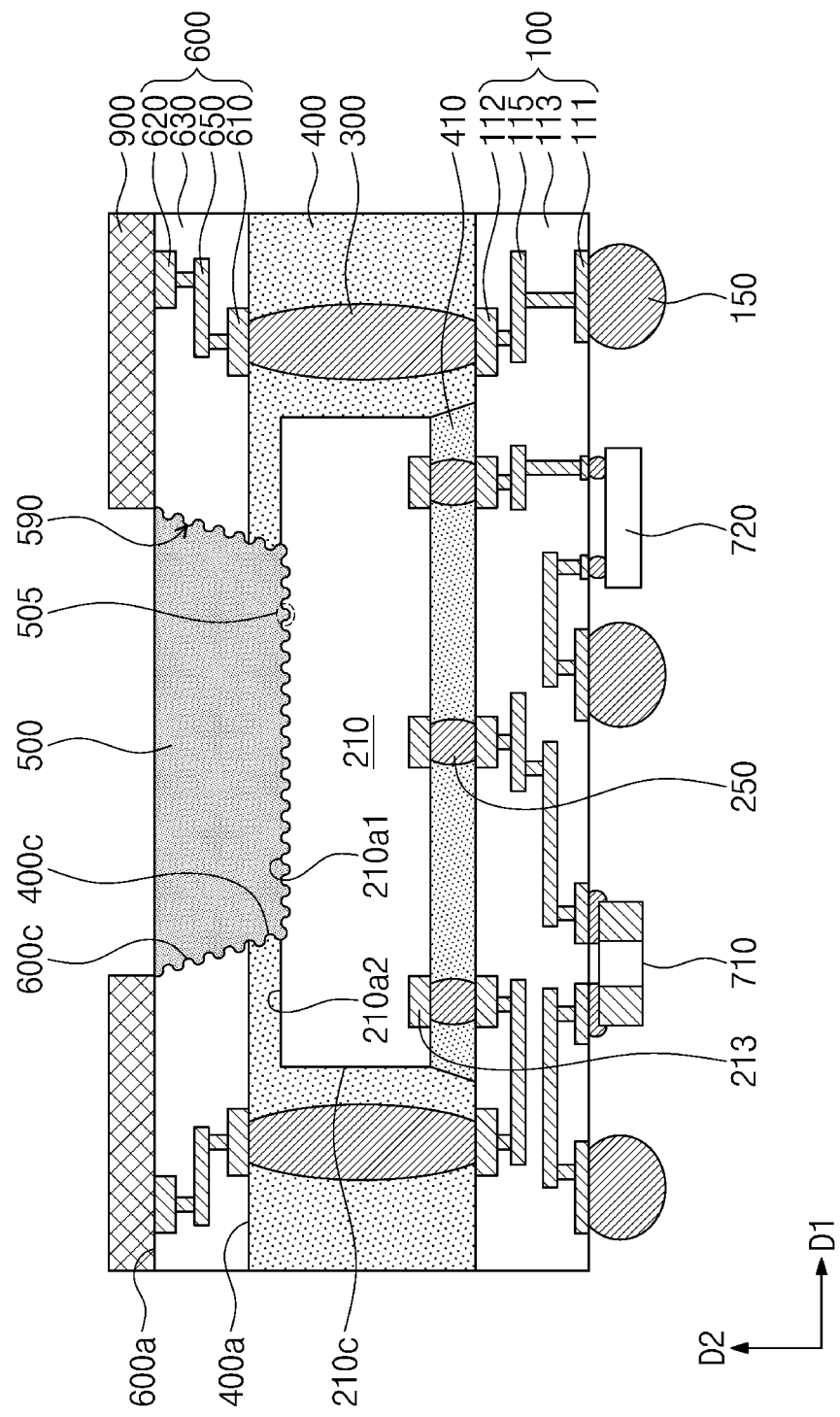

Referring to FIGS. 6C and 6D, preliminary particles 500P may be sprayed into the opening 590. The spraying of the preliminary particles 500P may be performed by a cold spraying process. The preliminary particles 500P may be a solid powder. The preliminary particles 500P may be formed of or may otherwise include copper (Cu), aluminum (Al), nickel (Ni), titanium (Ti), tungsten (W), tantalum (Ta), and/or silicon carbide (SiC). The preliminary particles 500P may be formed of or may otherwise include the same material or different materials. As a result of the spraying of the preliminary particles 500P, the heat dissipation structure 500 may be formed. The preliminary particles 500P may collide with the first top surface 210a1 of the first semiconductor chip 210, the inner side surface 600c of the second substrate 600, and the inner side surface 400c of the mold layer 400 at a relatively fast speed. In this case, as shown in FIG. 6D, the heat dissipation structure 500 may have the first protruding portions 505, which are formed on the first top surface 210a1 of the first semiconductor chip 210, the inner side surface 600c of the second substrate 600, and the inner side surface 400c of the mold layer 400. The surface roughness of the first top surface 210a1 of the first semiconductor chip 210, the surface roughness of the inner side surface 400c of the mold layer 400, and the surface roughness of the inner side surface 600c of the second substrate 600 after the formation of the heat dissipation structure 500 may be different from those before the formation of the heat dissipation structure 500. The surface roughness of the first top surface 210a1 of the first semiconductor chip 210, the surface roughness of the inner side surface 400c of the mold layer 400, and the surface roughness of the inner side surface 600c of the second substrate 600 after the formation of the heat dissipation structure 500 may be greater than the surface roughness of the side surface 210c of the first semiconductor chip 210, the surface roughness of the top surface 400a of the mold layer 400, and the surface roughness of the top surface 600a of the second substrate 600, respectively.

After a spray coating process is finished, an annealing process may be further performed on the heat dissipation structure 500. The annealing process may include thermally treating the heat dissipation structure 500. As a result of the annealing process, the preliminary particles 500P may be combined to each other. Accordingly, the preliminary particles 500P may form the first particles 501 described with reference to FIG. 1C or the first to third particles 501, 502, and 503 described with reference to FIG. 1D. There may be no observable interface between the first particles 501 or between the first to third particles 501, 502, and 503. The heat dissipation structure 500 may have the voids 570 described with reference to the embodiments of FIGS. 1C and 1D. Each of the voids 570 may be an empty space that is disposed between the first particles 501 or between the first to third particles 501, 502, and 503.

Referring back to FIG. 1A, the mask pattern 900 may be removed to expose the top surface 600a of the second substrate 600. A semiconductor package, according to an embodiment of the inventive concept, may be fabricated through the afore-described process.

According to an embodiment of the inventive concept, a semiconductor package may include a heat dissipation structure. Accordingly, it may be possible to increase thermal dissipation and operational reliability of the semiconductor package. It may be possible to prevent a warpage issue in the semiconductor package.

While example embodiments of the inventive concept have been particularly shown and described, it will be understood by one of ordinary skill in the art that variations in form and detail may be made therein without departing from the spirit and scope of the present disclosure.

What is claimed is:

1. A semiconductor package, comprising:
a first substrate;
a semiconductor chip disposed on the first substrate;
a mold layer disposed on the first substrate and covering the semiconductor chip; and
a heat dissipation structure disposed on a first top surface of the semiconductor chip and also disposed in the mold layer, the heat dissipation structure at least partially covering an inner side surface of the mold layer,
wherein a surface roughness of the first top surface of the semiconductor chip is greater than a surface roughness of a side surface of the semiconductor chip,
wherein a surface roughness of the inner side surface of the mold layer is greater than a surface roughness of a top surface of the mold layer, and
wherein the heat dissipation structure includes voids disposed therein.

2. The semiconductor package of claim 1, wherein the heat dissipation structure comprises protruding portions, and
wherein the protruding portions are disposed on both the first top surface of the semiconductor chip and the inner side surface of the mold layer.

3. The semiconductor package of claim 1, wherein the heat dissipation structure comprises particles that are connected to one another, and
wherein the voids are disposed between the particles.

4. The semiconductor package of claim 1, wherein a side surface of the heat dissipation structure is inclined at an angle with respect to a bottom surface thereof.

5. The semiconductor package of claim 1, wherein the heat dissipation structure comprises:
a first heat-dissipation layer at least partially covering the first top surface of the semiconductor chip;
a second heat-dissipation layer disposed on the first heat-dissipation layer; and
a third heat-dissipation layer disposed on the second heat-dissipation layer and exposed to a region on the top surface of the mold layer,
wherein a ratio of a mass of copper in the first heat-dissipation layer, relative to a total mass of the first heat-dissipation layer, and a ratio of a mass of copper in the third heat-dissipation layer, relative to a total mass of the third heat-dissipation layer, are each smaller than a ratio of a mass of copper in the second heat-dissipation layer, relative to a total mass of the second heat-dissipation layer.

6. The semiconductor package of claim 5, wherein the voids are disposed in each of the first heat-dissipation layer, the second heat-dissipation layer, and the third heat-dissipation layer.

7. The semiconductor package of claim 1, wherein a sum of areas of the voids, per unit area, in a lower portion of the heat dissipation structure is different than a sum of areas of the voids, per unit area, in an upper portion of the heat dissipation structure.

8. The semiconductor package of claim 1, further comprising a second substrate disposed on the top surface of the mold layer,
wherein the heat dissipation structure penetrates the second substrate and is in contact with an inner side surface of the second substrate, and
wherein a surface roughness of the inner side surface of the second substrate is greater than a surface roughness of a top surface of the second substrate.

9. The semiconductor package of claim 8, wherein the second substrate comprises an insulating layer and a ground conductive pattern disposed in the insulating layer, and
wherein the ground conductive pattern is exposed to an outside of the second substrate through the inner side surface of the second substrate and is in contact with the heat dissipation structure.

10. The semiconductor package of claim 1, wherein the semiconductor chip further comprises a second top surface,
wherein the heat dissipation structure is spaced apart from the second top surface of the semiconductor chip, and
wherein the surface roughness of the first top surface of the semiconductor chip is greater than a surface roughness of the second top surface.

11. A semiconductor package, comprising:
a first substrate;
a semiconductor chip disposed on the first substrate;
a conductive structure disposed on the first substrate, the conductive structure being laterally spaced apart from the semiconductor chip;
a mold layer disposed on the first substrate and at least partially covering the semiconductor chip and a side surface of the conductive structure;
a second substrate disposed on both the conductive structure and the mold layer; and
a heat dissipation structure disposed in both the mold layer and the second substrate and covering a top surface of the semiconductor chip,
wherein the heat dissipation structure comprises protruding portions,
wherein the protruding portions are in contact with the top surface of the semiconductor chip, an inner side surface of the mold layer, and an inner side surface of the second substrate, and
wherein the heat dissipation structure includes voids disposed therein.

12. The semiconductor package of claim 11, wherein a surface roughness of the top surface of the semiconductor chip is greater than a surface roughness of a side surface of the semiconductor chip,
wherein a surface roughness of the inner side surface of the mold layer is greater than a surface roughness of a top surface of the mold layer, and
wherein a surface roughness of the inner side surface of the second substrate is greater than a surface roughness of a top surface of the second substrate.

13. The semiconductor package of claim 11, wherein the second substrate further comprises:
signal conductive patterns spaced apart from the heat dissipation structure; and
a ground conductive pattern, that is electrically insulated from the signal conductive pattern and is exposed to an outside of the second substrate through the inner side surface of the second substrate,
wherein the heat dissipation structure is electrically connected to the ground conductive pattern.

14. The semiconductor package of claim 11, wherein an angle between bottom and side surfaces of the heat dissipation structure is an obtuse angle.

15. The semiconductor package of claim 11, wherein the second substrate comprises a re-distribution layer or an interposer substrate.

16. A semiconductor package, comprising:
first substrate including a first insulating layer and first conductive patterns;
solder balls disposed on a bottom surface of the first substrate;
a semiconductor chip disposed on a top surface of the first substrate;
a mold layer disposed on the top surface of the first substrate and covering the semiconductor chip; and
a heat dissipation structure disposed on a top surface of the semiconductor chip and in the mold layer,
wherein a thermal conductivity of the heat dissipation structure is greater than a thermal conductivity of the mold layer,
wherein the heat dissipation structure comprises first protruding portions,
wherein the first protruding portions are in contact with both the top surface of the semiconductor chip and an inner side surface of the mold layer, and
wherein the heat dissipation structure includes voids disposed therein.

17. The semiconductor package of claim 16, further comprising:
a conductive structure disposed on the first substrate and laterally spaced apart from the semiconductor chip; and
a second substrate disposed on both a top surface of the conductive structure and a top surface of the mold layer,
wherein the heat dissipation structure extends into the second substrate and is in contact with an inner side surface of the second substrate, and
wherein a surface roughness of the inner side surface of the second substrate is greater than a surface roughness of a top surface of the second substrate.

18. The semiconductor package of claim 17, further comprising an upper package mounted on the top surface of the second substrate,
wherein the upper package comprises an upper substrate, an upper semiconductor chip, an upper mold layer, and an upper heat dissipation structure,
wherein the upper heat dissipation structure is disposed on both a top surface of the upper semiconductor chip and in the upper mold layer,
wherein the upper heat dissipation structure comprises second protruding portions, and
wherein the second protruding portions are disposed on both the top surface of the upper semiconductor chip and an inner side surface of the upper mold layer.

19. The semiconductor package of claim 16, wherein the thermal conductivity of the heat dissipation structure ranges from 20 W/mK to 400 W/mK.

20. The semiconductor package of claim 16, wherein the heat dissipation structure comprises particles that are connected to each other,
wherein the voids are disposed between the particles, and
wherein the particles comprise copper (Cu), aluminum (Al), nickel (Ni), titanium (Ti), tungsten (W), tantalum (Ta), silicon (Si), silicon carbide (SiC), oxides thereof, and/or alloys thereof.

* * * * *